(12) United States Patent
Meier et al.

(10) Patent No.: US 6,180,869 B1
(45) Date of Patent: Jan. 30, 2001

(54) METHOD AND APPARATUS FOR SELF-DOPING NEGATIVE AND POSITIVE ELECTRODES FOR SILICON SOLAR CELLS AND OTHER DEVICES

(75) Inventors: Daniel L. Meier; Hubert P. Davis, both of Pittsburgh, PA (US)

(73) Assignee: Ebara Solar, Inc., Large, PA (US)

( * ) Notice: Under 35 U.S.C. 154(b), the term of this patent shall be extended for 0 days.

(21) Appl. No.: 09/072,411

(22) Filed: May 4, 1998

Related U.S. Application Data

(60) Provisional application No. 60/045,673, filed on May 6, 1997.

(51) Int. Cl.[7] ............................................. H01C 31/0224
(52) U.S. Cl. ........................................ 136/256; 257/461
(58) Field of Search .................................. 136/256, 261, 136/262; 257/461

(56) References Cited

U.S. PATENT DOCUMENTS

| 2,998,334 | 8/1961 | Bakalar ................................. 148/1.5 |
| 3,112,230 | 11/1963 | Rudenberg ............................. 136/89 |

(List continued on next page.)

FOREIGN PATENT DOCUMENTS

| 39452 | 2/1970 | (AU) . |
| 2939541A1 | 4/1981 | (DE) . |
| 1540917 | 10/1968 | (FR) . |
| 1416964 | 12/1975 | (GB) . |
| WO 97/13280 | 4/1997 | (WO) . |

OTHER PUBLICATIONS

V.N. Vysotskii et al., "Photovoltaic Cells With Aluminum Alloy Contacts And A Base Partially Doped With Lithium", Geliotekhnika, vol. 27, No. 3, pp. 16–19, Jan. 1, 1991, UDC 621.383.51:537.221.

(List continued on next page.)

Primary Examiner—Ellis Robinson
Assistant Examiner—Michael Miggins
(74) Attorney, Agent, or Firm—Squire, Sanders & Dempsey L.L.P.

(57) ABSTRACT

A self-doping electrode to silicon is formed primarily from a metal (major component) which forms a eutectic with silicon. A p-type dopant (for a positive electrode) or an n-type dopant (for a negative electrode) is alloyed with the major component. The alloy of major component and dopant is applied to a silicon substrate. Once applied, the alloy and substrate are heated to a temperature above the major component-silicon eutectic temperature such that the major component liquefies more than a eutectic proportion of the silicon substrate. The temperature is then decreased towards the eutectic temperature permitting molten silicon to reform through liquid-phase epitaxy and while so doing incorporate dopant atoms into its regrown lattice. Once the temperature drops below the major component-silicon eutectic temperature the silicon, which has not already regrown into the lattice, forms a solid-phase alloy with the major component and the remaining unused dopant. This alloy of major component, silicon and unused dopant is the final contact material. Alternatively, a self-doping electrode may be formed from an unalloyed metal applied to a silicon substrate. The metal and substrate are heated to a temperature above the metal-silicon eutectic temperature in an ambient gas into which a source of vaporized dopant atoms has been introduced. Dopant atoms in the ambient gas are absorbed by the molten mixture of metal-silicon to a much greater extent than they are absorbed by the solid silicon substrate surfaces. The temperature is then decreased to below the metal-silicon eutectic temperature. During this temperature decrease, the doped regrown silicon layer and the metal-silicon alloy final contact material are created in the same process as described above.

10 Claims, 9 Drawing Sheets

U.S. PATENT DOCUMENTS

| | | | | |
|---|---|---|---|---|
| 3,772,768 | * | 11/1973 | Fischer et al. | 29/572 |
| 3,895,975 | * | 7/1975 | Lindmayer | 148/178 |
| 3,988,167 | * | 10/1976 | Kressel et al. | 136/89 |
| 4,133,698 | | 1/1979 | Chiang et al. | 136/89 |
| 4,315,097 | | 2/1982 | Solomon | 136/255 |
| 4,737,197 | | 4/1988 | Nagahara et al. | 136/256 |
| 4,766,471 | * | 8/1988 | Ovshinsky et al. | 357/19 |
| 4,927,770 | | 5/1990 | Swanson | 437/2 |
| 5,260,604 | | 11/1993 | Harada et al. | 257/771 |
| 5,290,367 | * | 3/1994 | Hayashi et al. | 136/255 |

OTHER PUBLICATIONS

C. Cheek et al, "Aluminum Alloy High Efficiency Solar Cells", 18$^{th}$ Photovoltaic Specialists conference, Las Vegas, Oct. 21–25, 1985, vol. 1, Oct. 21–25, 1985, pp. 190–191, XP000132007, Institute of Electrical and Electronics Engineers.

Jurgen H. Werner and Uwe Spadaccini, "Low–temperature ohmic Au/Sb contacts to n–type Si", American Institute of Physics, pp. 994–997, 1994.

S.F. Nelson and T.N. Jackson, "Ohmic contacts to n–type silicon–germanium", American Institute of Physics, pp. 3563–3565, 1996.

P. Lolgen, W.C. Sinke, C. Leguijt, and A.W. Weeber, "Boron doping of silicon using coalloying with aluminium", American Institute of Physics, pp. 2792–2794, 1994.

P. Lolgen and C. Leguijt, J.A. Eikelboom, R.A. Steeman and W.C. Sinke, L.A. Verhoef, P.F.A. Alkemade and E. Algra, "Aluminium Back–Surface Doping Profiles With Surface Recombination Velocities Below 200 cm/s", 23$^{rd}$ IEEE Photovoltaic Specialists Conference—1993, pp. 236–242, 1993.

F.M. Roberts, E.L.G. Wilkinson, "The Controlling Factors In Semiconductor Large Area Alloying Technology", Journal of Materials Science 3, (1968) 110–119, pp. 110–119, 1968.

J. Horzel, J. Szlufcik, J. Nijs, R. Mertens, "A Simple Processing Sequence For Selective Emitters", 26$^{th}$ Photovoltaic Specialists Conference; Sep. 29–Oct. 3, 1997; Anaheim, California, pp. 139–142, IEEE 1997.

J.M. Gee, M.D.Bode and Beverly L. Silva, "Boron–Doped Back–Surface Fields Using An Aluminum–Alloy Process", 26$^{th}$ Photovoltaic Specialists Conference; Sep. 29–Oct. 3, 1997, Anaheim, California, pp. 275–278, IEEE 1997.

R.A. Sinton et al., "Large–Area 21% Efficient Si Solar Cells", Conf. Record 23$^{rd}$ IEEE Photovoltaic Specialists Conference, pp. 157–161, 1993.

R.A. Sinton et al., "27.5–Percent Silicon Concentrator Solar Cells" IEEE Electron Device Lett., EDL–7, No. 7, pp. 567–569, 1986.

Werner et al., "Low–temperature ohmic Au/Sb contacts to n–type Si", J. Appl. Phys. 75 (2), Jan. 15, 1994.*

H.S. Rauschenbach, "Solar Cell Array Design Handbook", Van Nostrand Reinhold Company, NY, pp. 156, 162, 50–51, Jan. 15, 1994.*

* cited by examiner

Ag-Sb DOT PROCESSED AT 900°C FOR 2 MINUTES

CURRENT DENSITY VERSUS VOLTAGE

METHOD AND APPARATUS FOR SELF-DOPING NEGATIVE AND POSITIVE ELECTRODES FOR SILICON SOLAR CELLS AND OTHER DEVICES

CROSS-REFERENCE TO RELATED APPLICATION

This application claims the benefit of U.S. Provisional Application 60/045,673, Express Mail Number EI219718346US, filed May 6, 1997, to Daniel L. Meier and Hubert Preston Davis, entitled Self-Doping Negative and Positive Electrodes for Silicon Solar Cells and Other Devices, under 35 U.S.C. §119(e), which is herein incorporated by reference.

FIELD OF THE INVENTION

The present invention relates to metal contacts to silicon solar cells and other silicon devices in which the contact material includes a supply of dopant atoms, thereby acting as its own dopant source, to facilitate the formation of a low-resistance ohmic contact between the contact material and the silicon.

BACKGROUND OF THE INVENTION

In a properly designed p-n junction solar cell, the electrons move to the metal electrode which contacts the n-type silicon, and the holes move to the metal electrode which contacts the p-type silicon. These contacts are vitally important to the performance of the cell, since forcing current across a high resistance silicon/metal interface or through a high resistance electrode material robs useful power from the cell. The total specific series resistance of the cell, including interfaces and electrode material, should be no more than 1 $\Omega$-cm$^2$.

The need for a low-resistance contact places a fairly demanding requirement on the concentration of dopant atoms at the surface of the semiconductor. For n-type silicon, this dopant concentration must be $\geq 1\times10^{19}$ atoms/cm$^3$ (which is 200 parts per million atomic (ppma) based upon a density for silicon of $5\times10^{22}$ atoms/cm$^3$). For p-type silicon the requirement is less severe, with a surface concentration $\geq 1\times10^{17}$ atoms/cm$^3$ (2 ppma) being required. Furthermore, to maximize the electrical efficiency of a solar cell, it is often desirable to have a lower surface doping concentration everywhere except directly beneath the metal electrode.

Thus, it is desirable for a contact material to possess the following properties: an ability to supply a liberal amount of dopant to the silicon immediately beneath it (also known as self-doping), has high electrical conductivity, makes a mechanically strong bond to the silicon, does not degrade the electrical quality of the silicon by introducing sites where electrons and holes can be lost by recombination, inexpensive and lends itself to being applied by an economical process (such as screen printing).

A known contact material which possesses, to a significant extent, the above-described desirable properties, is aluminum. Aluminum possesses these properties when used for contacting p-type silicon and therefore forming the positive electrode in a silicon solar cell. This is due to the fact that aluminum itself is a p-type dopant in silicon. Aluminum can dope silicon, as part of a process which alloys the aluminum with the silicon, provided the processing temperature exceeds the aluminum-silicon eutectic temperature of 577° C. The aluminum-silicon phase diagram is given in FIG. 1. The vertical axis of FIG. 1 is temperature in degrees centigrade, while the horizontal axis is percentage silicon. The horizontal axis has two scales: a lower scale of percent silicon (atomic) and an upper scale of percent silicon (by weight). FIG. 1 indicates a eutectic point 102 at 577° C. with 12.5% Si and 87.5% Al (by weight). Line 100 indicates 577° C. and therefore eutectic point 102 lies on this line. While the numbers directly below point 102 indicate 11.3% (atomic) and 11.7% (by weight) of Si at the eutectic, the more accurate data of detail graph 101 indicates that it is 12.1% (atomic) and 12.5% (by weight). It can be seen from curve 103 (which rises rightwards from point 102), that as the temperature further increases above the eutectic the percentage of Si, which can be held in a molten mixture of Si and Al, also increases. The alloying of aluminum and silicon at a temperature above the eutectic temperature produces: (i) a near-surface silicon region which is adequately doped with aluminum for low contact resistance, (ii) an electrode material having the aluminum-silicon eutectic composition which has a sufficiently high electrical conductivity for carrying solar cell currents, and (iii) excellent adherence between the eutectic conductor and the silicon substrate. Aluminum is also an inexpensive material which can be applied by screen printing using commercially available pastes.

For conventional solar cell structures the lack of a material, comparable to aluminum, for contacting n-type silicon in order to form the negative electrode of a solar cell, also makes the fabrication of a simple, cost-effective solar cell difficult. In a conventional solar cell structure, with a p-type base, the negative electrode (which contacts the n-type emitter) is typically on the front (illuminated) side of the cell and the positive electrode is on the back side. In order to improve the energy conversion efficiency of such a cell, it is desirable to have heavy doping beneath the metal contact to the n-type silicon and light doping between these contacts. One means that has been employed to accomplish this, termed "emitter etch back," is to begin with heavy doping over the entire front surface, and then to etch away part of the emitter after the contact metal has been applied. Such an etch-back process is time-consuming and difficult to control, since the heavily-doped layer is usually only ≈0.3 μm deep.

The "emitter" is known in the solar cell art to be a thin layer that is doped in order to create a rectifying (also known as "p-n") junction capable of generating electrical current upon illumination. The "base" is that region which forms the other half of the p-n junction and is therefore doped to be of a semiconductor type opposite to that of the emitter. The base extends from the boundary of the emitter region to those contacts making ohmic electrical contact to the base. The emitter is thin with respect to the base.

Thus, the conventional silicon solar cell structure presently suffers from either increased processing complexity (to remove the n$^+$ layer) or a loss of performance (if the n$^+$ layer remains) because of the opposing demands for high doping density beneath the contact metal and low doping density between the contact metal areas.

SUMMARY OF THE INVENTION

The present invention is addressed to a combination of materials and processing conditions which produce a self-doping electrode.

The self-doping electrode is formed primarily from a metal (major component) which forms a eutectic with silicon.

A dopant is then alloyed with the major component. A relative composition of major component to dopant is selected such that the alloy formed is: i) of a single uniform solid phase and ii) transitions directly to a liquid phase. If p-type doping is desired, the dopant alloyed with the major component is selected from Group III of the Periodic Table, whereas if n-type doping is desired, the dopant alloyed with the major component is selected from Group V of the Periodic Table.

The alloy of major component and dopant may be applied to the silicon substrate by either sputtering or, if a paste is used, by screen printing. In the screen printing paste each individual particle is itself an alloy of major component and dopant.

Once applied, the alloy and substrate are heated to a temperature above the major component-silicon eutectic temperature such that: i) the major component liquefies more than a eutectic proportion of the silicon substrate and ii) the alloy of major component and dopant is at least partially melted.

The temperature is then decreased towards the eutectic temperature. As the temperature is decreased, the molten silicon reforms through liquid-phase epitaxy and while so doing dopant atoms are incorporated into the regrown lattice.

Once the temperature drops below the major component-silicon eutectic temperature the silicon which has not already been reincorporated into the substrate through epitaxial regrowth forms a solid-phase alloy with the major component and the remaining unused dopant. This alloy of major component, silicon and unused dopant is the final contact material. The final contact material is composed of eutectic proportions of silicon and major component. It is expected that under eutectic proportions there will be significantly more major component than silicon in the final contact material, thereby insuring good electrical conductivity of the final contact material.

Alternatively, a self-doping negative electrode may be formed from unalloyed Ag which may be applied to the silicon substrate by either sputtering, screen printing a paste or evaporation.

Once applied, the Ag and substrate are heated to a temperature above the Ag—Si eutectic temperature (but below the melting point of Si) in an ambient gas into which a source of P (phosphorous) vapor has been introduced. The Ag liquifies more than a eutectic proportion of the silicon substrate. P atoms in the ambient gas are absorbed by the molten mixture of Ag—Si to a much greater extent than they are absorbed by the solid Si surfaces.

The temperature is then decreased towards the eutectic temperature. As the temperature is decreased, the molten silicon reforms through liquid-phase epitaxy and while so doing P dopant atoms are incorporated into the regrown lattice.

Once the temperature drops below the silver-silicon eutectic temperature the silicon which has not already been reincorporated into the substrate through epitaxial regrowth forms a solid-phase alloy with the silver. This alloy of silver and silicon is the final contact material. The final contact material is composed of eutectic proportions of silicon and silver. Under eutectic proportions there is significantly more silver than silicon in the final contact material, thereby insuring good electrical conductivity of the final contact material.

Instead of silver, it is expected that other metals (such as tin) are suitable. Other members of Group V of the Periodic Table may also be used, instead of P, as a dopant vapor to form a negative electrode. Members of Group III may be used as a dopant vapor, instead of P, to form a positive electrode.

Advantages of the invention will be set forth, in part, in the description that follows and, in part, will be understood by those skilled in the art from the description or may be learned by practice of the invention. The advantages of the invention will be realized and attained by means of the elements and combinations particularly pointed out in the appended claims and equivalents.

BRIEF DESCRIPTION OF THE DRAWINGS

The accompanying drawings, that are incorporated in and constitute a part of this specification, illustrate several embodiments of the invention and, together with the description, serve to explain the principles of the invention.

DETAILED DESCRIPTION OF PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

The lack of a material comparable to aluminum, for contacting n-type silicon in order to form the negative electrode of a solar cell, also makes the fabrication of a simple, cost-effective interdigitated back contact (IBC) solar cell particularly difficult. An IBC solar cell is characterized by having both its positive and negative electrodes on the same side of the cell. A heavily-doped ($>1 \times 10^{19}$ cm$^{-3}$) $n^+$ layer, needed to assure ohmic contact to the negative electrodes of the IBC cell, can act as an electrical shunt between the cell's positive and negative electrodes. To avoid this problem, the n⁺ layer between the positive and negative electrodes must be removed by acid etching or by reactive ion etching.

Figure 2A:
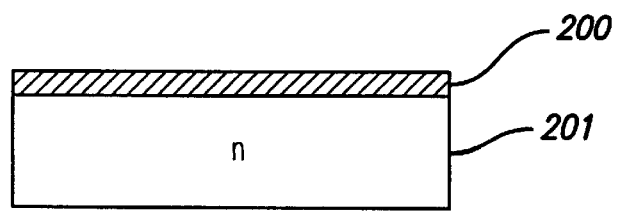
FIGS. 2A–E render a process for the formation and removal of an $n^+$ layer.
Figure 2B:
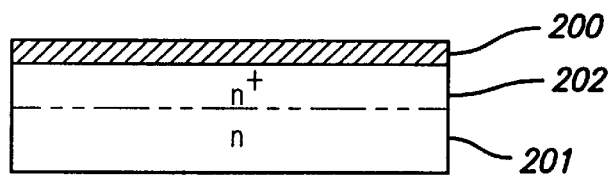
Figure 2C:
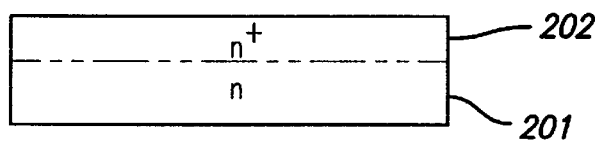
Figure 2D:
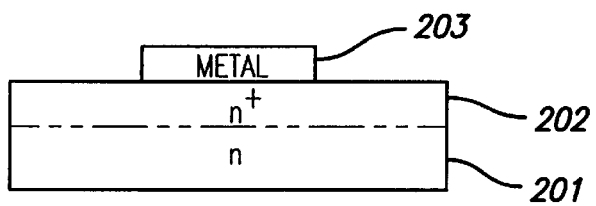
Figure 2E:
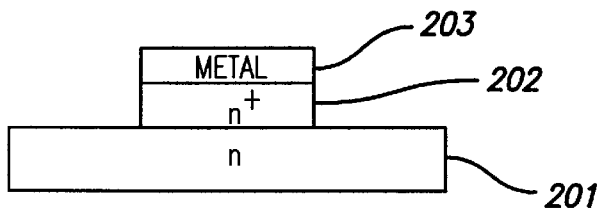

The process sequence for creating the negative electrode for an IBC cell is rather cumbersome requiring at least five distinct steps (diagrammed in FIGS. 2A–E). This complexity is a result of the need to create and remove an n⁺ layer. The dopant source 200, such as a liquid containing phosphorus, is first applied to the silicon substrate 201's surface (FIG. 2A). A liquid dopant source 200 may, for example, be applied by being spun onto substrate 201's surface. The dopant 200 is partially transferred from the source into the silicon by diffusion in a high temperature (≈900° C.) step (FIG. 2B) to form the n⁺ layer 202. Removal of the dopant source 200, to reveal the surface of silicon substrate 201, follows (FIG. 2C). The metal contact 203 is then deposited by some method such as sputtering, evaporation, or, if a paste is used, by screen printing (FIG. 2D). If sputtering or evaporation is used, the metal film must be patterned, typically with a photoresist process (not shown). If screen-printing is used, a second high temperature (firing) step (≈700° C.) is needed at this point to promote contact to the silicon. Finally, the undesired n⁺ layer 202 outside the metal contact area 203 is etched away (FIG. 2E) to isolate the negative electrode from the positive electrode.

The process depicted in FIGS. 2A–E has been used to fabricate IBC cells from dendritic web silicon substrates using screen-printed aluminum for the positive electrode and screen-printed silver for the negative electrode materials. Such an IBC cell is disclosed in U.S. Pat. No. 5,641,362 to Meier, herein incorporated by reference. In this structure, the interdigitated lines have a nominal width of 1000 $\mu$m for aluminum and 100 $\mu$m for silver, with a 100 $\mu$m gap between lines. The best such screen-printed web IBC cell, as constructed by EBARA Solar, Inc., of Large, Pa., was 2.5 cm² in area, and had a measured energy conversion efficiency of 10.4% with the cell covered with isopropyl alcohol to simulate an EVA/Tefzel encapsulation and with the data corrected to 25° C. This cell was fabricated on an 8.1 Ω-cm web substrate that was 114 $\mu$m thick, had phosphorus diffusions on both front and back surfaces with an average sheet resistance of 28 Ω/□ on each side, a screen-printed aluminum alloy junction formed at 800° C. in a belt furnace under an air cover (the belt furnace made by Radiant Technology Corp or RTC), a screen-printed silver negative electrode fired at 750° C. in an RTC belt furnace under an air cover, and a TiO₂ antireflective coating deposited by atmospheric pressure chemical vapor deposition (APCVD). In this cell the shunting path between the aluminum and silver electrodes was broken by wet etching the n⁺ layer between the electrodes with acids. Solar cell parameters and the illuminated I-V curve for this cell are shown in FIG. 7.

Figure 7:
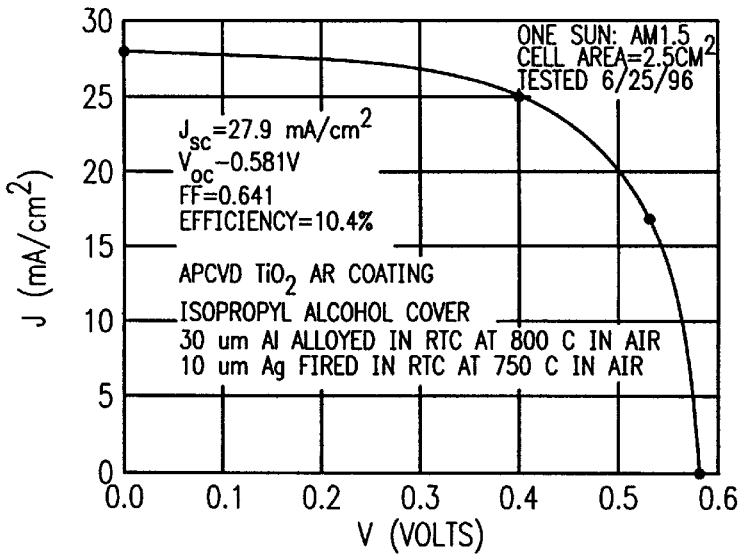
FIG. 7 illustrates the electrical characteristics for a dendritic web silicon IBC solar cell.

The vertical axis of FIG. 7 is solar cell current density (J) expressed as mA per normalized units of 1 cm² solar cell area. The horizontal axis represents the solar cell's voltage output. As indicated in the upper right hand corner of FIG. 7, the solar cell was tested under an illumination of one sun (100 mW/cm²) with a spectral content approximating a 1.5 Air Mass (AM). The total area of the cell is 2.5 cm². $J_{sc}$ is the short circuit current density of the solar cell and is where the I-V curve intersects the J axis at 27.9 mA/cm². $V_{oc}$ is the open circuit voltage of the solar cell and is where the I-V curve intersects the V axis at 0.581 volts. The maximum power is output from the cell when it is operating at a point in the "knee" of the curve. This maximum power point defines an actual maximum power rectangle by: i) drawing a line from the maximum point to the J axis which is perpendicular to the J axis, and ii) drawing a line from the maximum power point to the V axis which is perpendicular to the V axis. The maximum theoretical power output of the cell is defined by the theoretical maximum power rectangle created by: i) drawing a line rightward from $J_{sc}$ which is perpendicular to the J axis, and ii) drawing a line upward from V which is perpendicular to the V axis. The extent to which the actual maximum power rectangle fills the theoretical maximum power rectangle is called the "Fill Factor" (FF) which is 0.641 for this cell. The Fill Factor is limited by i) the total specific series resistance of the cell (which should be as close to zero as possible), and ii) the shunt resistance between the cell's positive and negative electrodes (which should be as close to infinity as possible). The efficiency of the cell, which is the percentage of light power converted to electric power, is 10.4%. Also shown in FIG. 7 is the fact that after alloying, the Al electrodes were 30 $\mu$m thick while the Ag electrodes were 10 $\mu$m thick.

Thus, the IBC structure (as well as the conventional silicon solar cell structure discussed above) presently suffers from either an increased processing complexity (to remove the n⁺ layer) or from a loss of performance (if the n⁺ layer remains) because of the opposing demands for high doping density beneath the contact metal and low doping density between the contact metal areas.

The present invention specifies a combination of materials and processing conditions which produces a self-doping negative electrode for silicon solar cells, similar in function to the widely-used aluminum self-doping positive electrode. Experimental results show that a combination of antimony as the n-type dopant and silver as the primary contact metal satisfies the basic requirements for a self-doping negative electrode. Furthermore, these results suggest a clear path for creating an analogous self-doping positive electrode, using gallium and silver, which is superior in several ways to the established aluminum electrode. The use of self-doping negative and positive electrodes, both of which being constructed in accordance with the present invention, permits a streamlined fabrication process in which the negative electrode, positive electrode, and silicon dioxide surface passivation layer can be formed simultaneously in a single high-temperature step. Such a process is defined below for an IBC cell.

Figure 1:
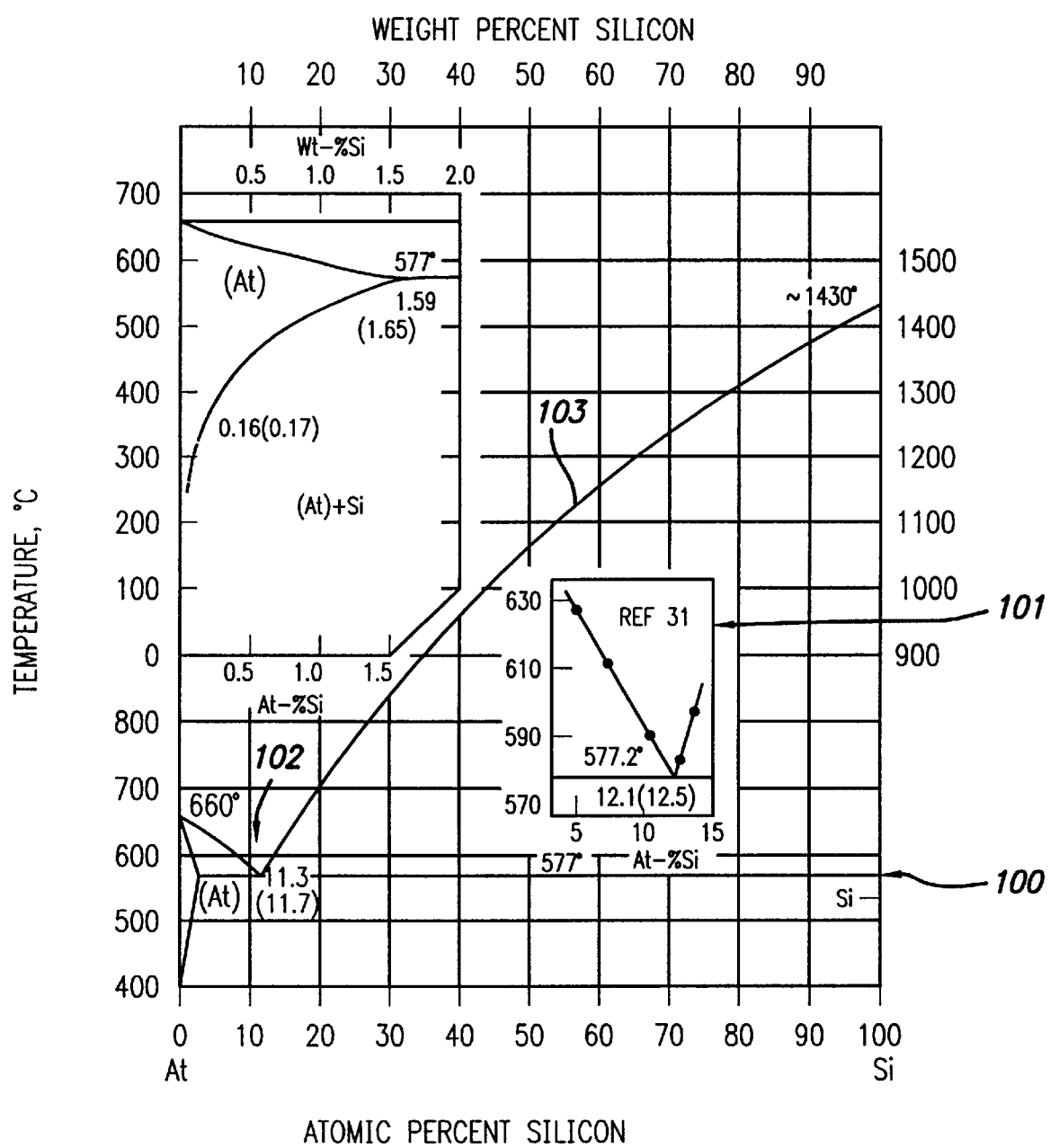
FIG. 1 depicts the aluminum-silicon phase diagram which is utilized in accordance with the present invention.
Figure 3:
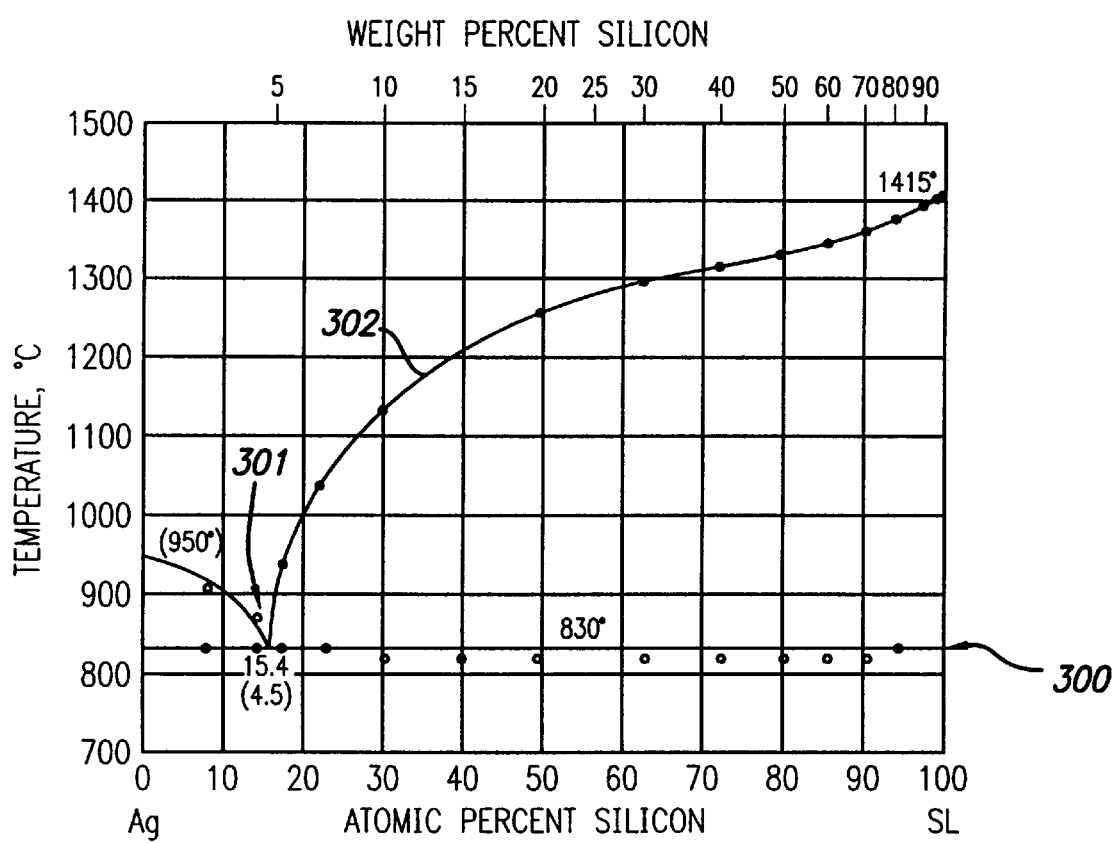
FIG. 3 illustrates the silver-silicon phase diagram which is utilized in accordance with the present invention.

The silver-silicon phase diagram is given in FIG. 3. The vertical axis of FIG. 3 is temperature in degrees centigrade, while the horizontal axis is percentage silicon. The horizontal axis has two scales: a lower scale of percent silicon (atomic) and an upper scale of percent silicon (by weight). FIG. 3 shows a eutectic point 301 at 830° C. with 95.5% Ag and 4.5% Si (by weight). Eutectic point 301 lies on line 300 which indicates a temperature of 830° C. Curve 302 (which rises rightward from point 301) indicates that as the temperature is further increased above the eutectic, the percent Si, which can be held in a molten mixture of Si and Ag, also increases. Note FIG. 3 similarity to the aluminum-silicon phase diagram of FIG. 1. In both cases the metal forms a eutectic with silicon (eutectic temperature of 577° C. for aluminum and 830° C. for silver). Silver is therefore capable of dissolving silicon at temperatures above 830° C., and then allowing the silicon to recrystallize by liquid phase epitaxy upon cooling, in analogy with the behavior of aluminum. Unlike aluminum, however, silver is not a dopant in silicon, so a dopant, some of which will remain in the silicon upon epitaxial regrowth, must be added to the silver.

Figure 4:
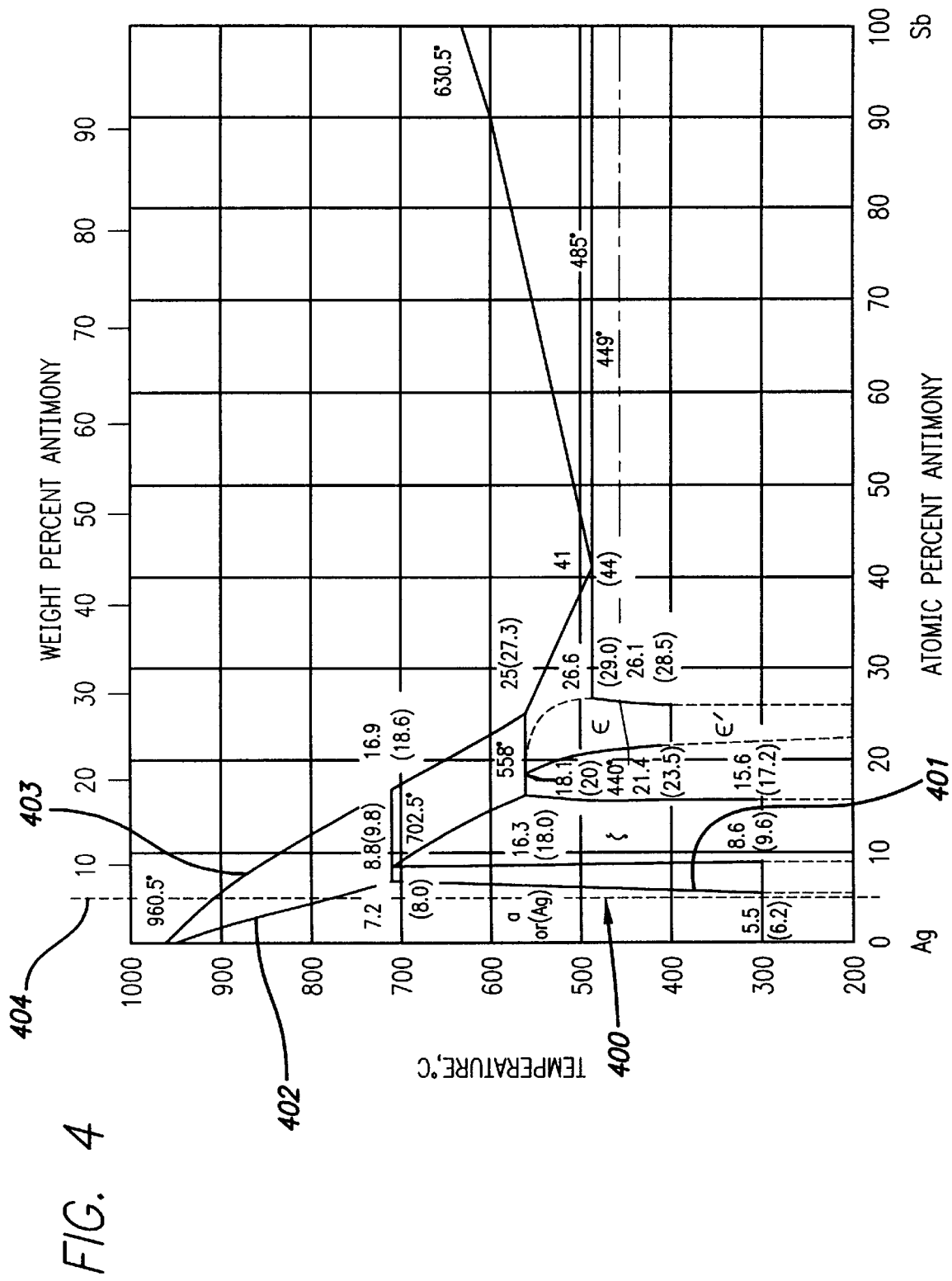
FIG. 4 depicts the silver-antimony phase diagram which is utilized in accordance with the present invention.

Antimony is the dopant of choice because of its high solubility in silicon, its low cost, and the fact that an alloy of antimony and silver exists as a single, uniform phase for low antimony concentrations. This can be seen from the silver-antimony phase diagram of FIG. 4. The vertical axis of FIG. 4 is temperature in degrees centigrade, while the horizontal axis is percentage antimony. The horizontal axis has two scales: a lower scale of percent antimony (atomic) and an upper scale of percent antimony (by weight). In particular, an alloy of 5% Sb and 95% Ag, by weight, falls within the single-phase (the phase being a solid) region 400 (also labeled α) of FIG. 4. Region 400 is bounded on the left by the temperature axis and on the right by lines 401 and 402. The phase changes of a 5% Sb alloy, with respect to temperature, is represented by line 404. As can be seen, line 404 remains within region 400 until the temperature exceeds 790° C. and thereby crosses line 402. Therefore, such an alloy remains a uniform solid until melting is initiated at 790° C. Above line 402 on line 404, but below line 403, the alloy is a two-phase mixture of solid and liquid. When line 404 reaches line 403, at 920° C., the alloy is entirely liquid.

The two key aspects of the phase changes of the Sb—Ag alloy, and the reason that a concentration of 5% was chosen, are that: i) it is a uniform solid until melting is initiated, and ii) it transitions directly from a uniform solid to a melting phase.

The silver-silicon eutectic composition is 95.5% silver and 4.5% silicon, by weight. This silver-silicon eutectic ratio gives a way of determining the amount of silicon that a given thickness of silver will dissolve, and thereby provides a means for estimating the depth of the junction between the expitaxially regrown silicon and the underlying unchanged silicon substrate. It is the expitaxially regrown silicon which forms the n$^+$ region when an alloy of Sb and Ag is used. The ratio of thickness of silicon dissolved ($t_{Si}$) to thickness of silver deposited ($t_{Ag}$) at an alloying temperature (T) is given by:

$$(t_{Si})/(t_{Ag}) = (\rho_{Ag})/(\rho_{Si}) * [w_{Si}(T)/(1-w_{Si}(T))] \quad (1)$$

Where $\rho_{Ag}$ is the density of silver (10.5 g/cm$^3$), $\rho_{Si}$ is the density of silicon (2.33 g/cm$^3$), and $w_{Si}(T)$ is the weight percent of silicon at the processing temperature. With $w_{Si}$(T=900° C.) of 0.04 from the phase diagram, the thickness ratio is calculated from equation (1) to be 0.19. For example, a 10 μm thick silver layer will dissolve 1.9 μm of silicon at 900° C., and create a junction depth (with respect to the original silicon substrate surface) of 1.9 μm upon epitaxial regrowth.

The doping density in the regrown layer can be estimated if a segregation coefficient for antimony (ratio of antimony concentration in the growing solid to antimony concentration in the liquid) is assumed. The segregation coefficient for antimony from a Czochralski silicon melt at 1415° C. is 0.023. The molten material under consideration here has a composition, expressed in atomic percent, of approximately 76% silver, 20% silicon, and 4% antimony and is at 900° C. However, since silver is not accepted into the silicon lattice to any appreciable extent, the incorporation of antimony can, to a first approximation, be assumed to be independent of the presence of silver. In that case, the expected doping concentration of antimony in silicon is estimated to be:

$$N_{Sb} = k_{Sb} * f_{Sb} * N_{Si} \quad (2)$$

where $k_{Sb}$ is the antimony segregation coefficient (which is estimated to remain at 0.023 for liquid phase expitaxial regrowth from 900° C.), $f_{Sb}$ is the fraction of atoms in the molten material which are antimony (0.04), and $N_{Si}$ is the density (atomic) of silicon atoms in the solid (5×10$^{22}$ cm$^{-3}$).

Thus, the antimony doping concentration in the regrown solid ($N_{Sb}$) is estimated to be 5×10$^{19}$ cm$^{-3}$. This value exceeds the minimum required (1×10$^{19}$ cm$^{31\ 3}$) to facilitate an ohmic contact to n-type silicon.

Figure 5A:
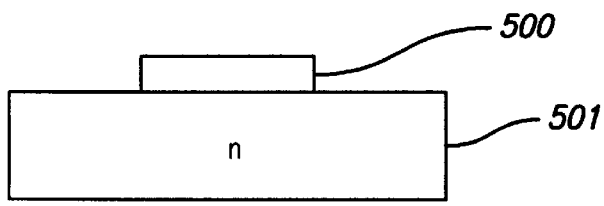
FIGS. 5A–B render a process for utilizing a self-doping alloy in accordance with the present invention.
Figure 5B:
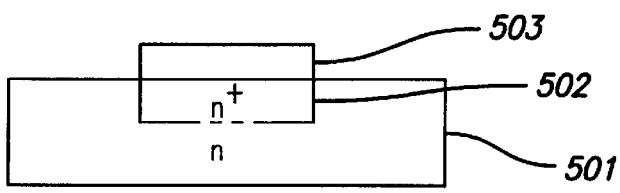

The simple sequence required in executing the disclosed invention is shown in FIGS. 5A–B. A homogeneous (single phase) alloy 500 comprising: i) a metal with a high electrical conductivity (major component), and ii) an n-type dopant from Group V of the Periodic Table is formed. This alloy 500 is deposited on the surface of an n-type silicon substrate 501, as shown in FIG. 5A. The alloy 500 can be deposited by a variety of standard methods such as sputtering or, if a paste is used, by screen-printing. The alloy 500 must be capable of dissolving some silicon, during its alloying process with the silicon, so that a molten combination of conductive metal, dopant atoms, and silicon is formed at the processing temperature. Upon cooling, the silicon is regrown epitaxially from the molten mixture, and dopant atoms are incorporated into the regrown silicon at a sufficient concentration to create an n$^+$ region 502 of FIG. 5B. The n$^+$ region 502, which is created only beneath alloy 500, produces an ohmic contact. Because fresh silicon is exposed in this process, the adherence of the final contact material 503 (which has gone from being an alloy 500 of Ag and Sb in FIG. 5A to an alloy 503 of Ag, Sb and Si in FIG. 5B) to the n$^+$ region 502 of the silicon substrate (the region which has been doped with the Sb) is expected to be quite good. Like the alloy 500 of FIG. 5A, alloy 503 of FIG. 5B is still mostly Ag.

The preferred conductive metal for this invention is silver and the preferred dopant is antimony. In addition to its high electrical conductivity, silver has the desirable property that its oxide is unstable at temperatures only modestly elevated above room temperature. This means that the alloying process of FIG. 5 will yield a contact with an oxide-free surface, even if the alloying is done in air or in oxygen. The oxide-free silver contact is very well suited for soldering when cells are interconnected to form a module. In addition, the formation of a self-doping negative electrode at a temperature in the range of 800° C. to 1000° C. means its formation can be combined with the creation of a thermal oxide layer grown on the exposed silicon substrate. This oxide layer would serve to passivate the silicon surface, thereby reducing the loss of photogenerated electrons and holes by recombination at the surface.

Figure 6:
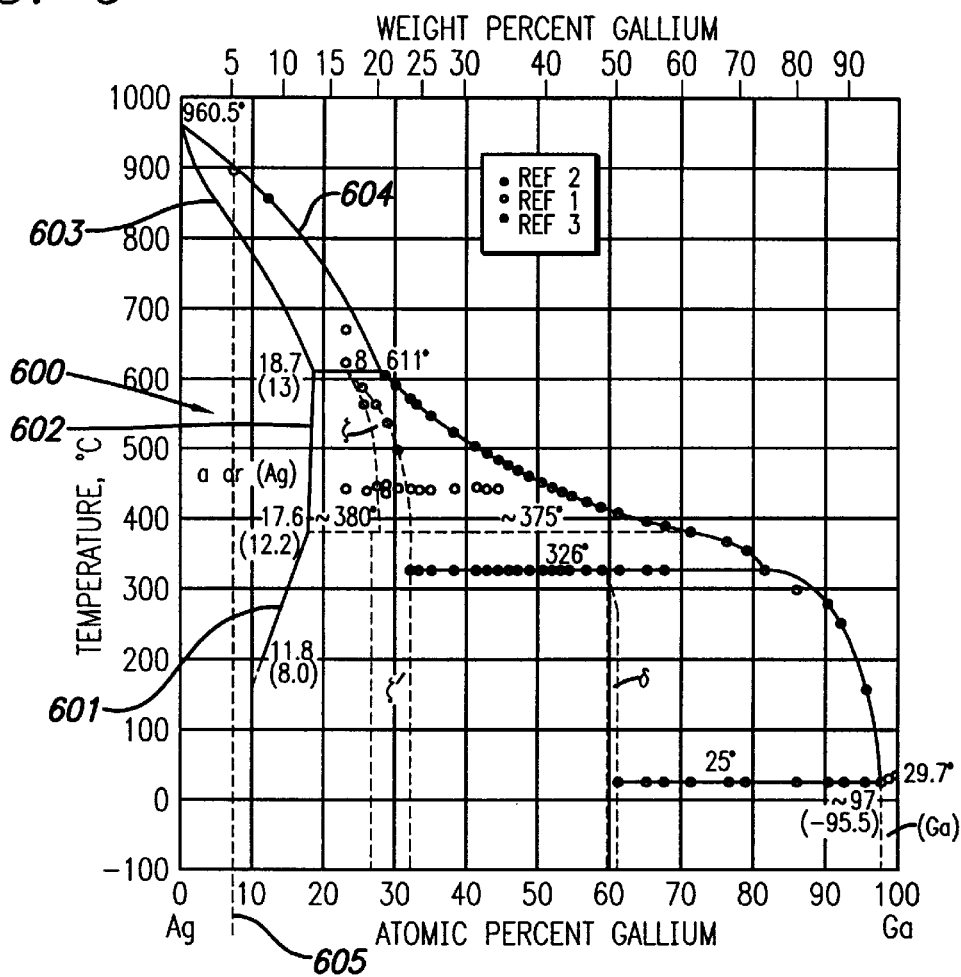
FIG. 6 depicts the silver—gallium phase diagram which is utilized in accordance with the present invention.

The invention is not limited to making contacts to n-type silicon. Since the highly-conductive component of the contact system (e.g., silver) is chosen for its ability to alloy with silicon, the dopant that is added to this component can be from either Group V (contact to n-type silicon) or from Group III (contact to p-type silicon). Examination of binary phase diagrams, each depicting the combination of a Group III element with silver, suggests that gallium or indium would function similarly to antimony. Because gallium has a larger segregation coefficient than indium (0.0080 compared to 0.0004) and an acceptor energy level closer to the valence band edge (0.065 eV compared to 0.16 eV), gallium is preferred over indium. Using the methodology developed for equation (2), and assuming a fraction (atomic) of 0.04 of gallium in the molten material, the estimated gallium doping concentration in the regrown silicon is 2×10$^{19}$ cm$^{-3}$. This significantly exceeds the minimum of 1×10$^{17}$ cm$^{-3}$ required for ohmic contact to p-type silicon. The phase diagram for the silver—gallium system is given in FIG. 6. The vertical axis of FIG. 6 is temperature in degrees centigrade, while the horizontal axis is percentage gallium. The horizontal axis has two scales: a lower scale of percent gallium (atomic) and an upper scale of percent gallium (by weight). FIG. 6 shows that a composition of 5% Ga and 95% Ag (by weight) falls within a single-phase region 600. Region 600 is bounded on the left by the temperature axis and on the right by lines 601, 602 and 603. The phase changes of a 5% Ga alloy, with respect to temperature, is represented by line 605. As can be seen, line 605 remains within region 600 until the temperature exceeds 800° C. and thereby crosses line 603. Therefore, such an alloy remains a uniform solid until melting is initiated at 800° C. Above line 603, but below line 604, the alloy is a two-phase mixture of solid and liquid. When line 605 reaches line 604, at 900° C., the alloy is entirely liquid.

Note the similarity of FIG. 6 to the silver-antimony phase diagram of FIG. 4 in that for both, for alloys of high-silver concentration, the alloy is a uniform solid until melting is initiated and that the alloy transitions directly from a uniform solid to a melting phase.

A process for fabricating IBC cells, using self-doping negative and positive electrodes, in a silicon substrate such as dendritic web silicon, is as described in the following 6-step process which is also illustrated through FIGS. 8A–E:

1. Diffuse an $n^+$ layer 801 into top (or light facing) side of the silicon substrate 800 of either conductivity type. FIGS. 8A–E deal with the case of an n-type substrate. In the case of dendritic web silicon, it is possible to do $n^+$ doping during crystal growth using a solid planar diffusion source (in situ phosphorus diffusion) as described in U.S. patent application entitled *In-Situ Diffusion of Dopant Impurities During Dendritic Web Growth of Crystal Ribbon,* Ser. No. 08/725,454, filed Oct. 4, 1996, to Balakrishnan R. Bathey, which is herein incorporated by reference. Otherwise, it could be done by screen-printing a phosphorus paste or applying a liquid phosphorus dopant to top side of the substrate and driving the phosphorus into the silicon at a temperature of 800° C. to 1000° C. in a rapid thermal processing (RTP) unit or some other furnace.

2. Upon stripping the diffusion glass from the top of the substrate (this glass is a result of the phosphorous dopant liquid or paste of step 1), screen print on the back side (side without phosphorus diffusion) a silver—gallium paste and dry at ≈200° C. The silver—gallium paste is depicted by regions 802–805 in FIG. 8B.

3. Screen print a silver-antimony paste (depicted as regions 806–808 in FIG. 8C) on the back side in an interdigitated pattern, and "burn off" the organic binders, of both the silver—gallium and silver-antimony pastes, at ≈400° C.

Figure 8A:
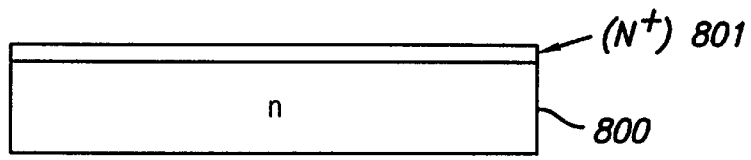
FIGS. 8A–E render a process for fabricating dendritic web silicon IBC solar cells in accordance with the present invention.
Figure 8B:
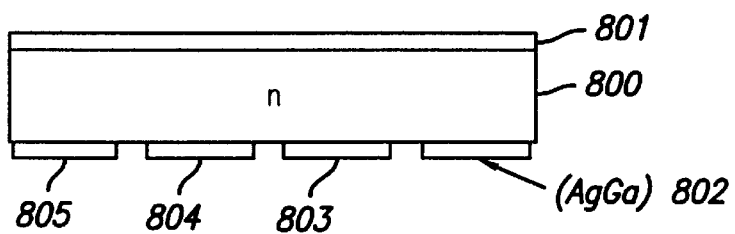
Figure 8C:
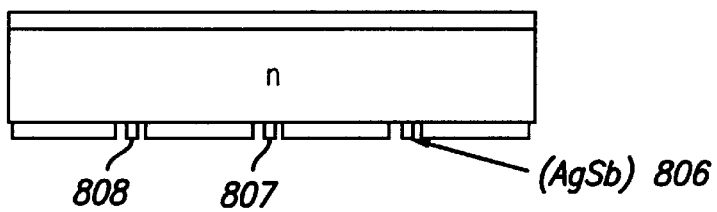
Figure 8D:
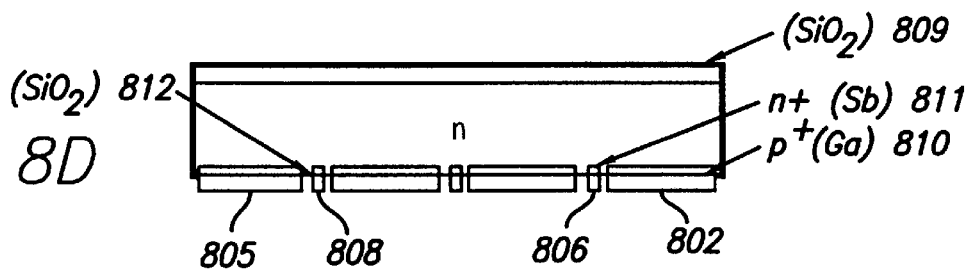
Figure 8E:
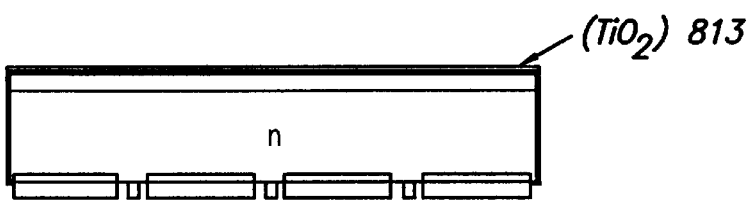

4. Simultaneously form the self-doping positive electrode (Ag—Ga), the self-doping negative electrode (Ag—Sb), and the p-n junction (Ga for n-base or Sb for p-base), while growing a thermal oxide ($SiO_2$) to passivate the exposed silicon surfaces. This process can be accomplished in an RTP at ≈900° C. for 2 minutes in oxygen. In the case of an n-type silicon substrate, a $p^+n$ junction is formed between the $p^+$ emitter created by the self-doping positive electrode and the n-type substrate. In the case of an p-type silicon substrate, an $n^+p$ junction is formed between the $n^+$ emitter created by the self-doping negative electrode and the p-type substrate. This step of simultaneous formation is depicted by FIG. 8D. As can be seen, silver—gallium paste region 802 forms $p^+$ region 810 in the n-type substrate 800 and thus creating a $p^+n$ junction. The same process occurs at paste regions 803–805. Silver-antimony paste region 806 forms an $n^+$ region 811 in order to make ohmic contact with the n-type substrate 800. All exposed Si areas also form $SiO_2$ layers. In particular, the top side $n^+$ layer 801 is covered with oxide layer 809. In addition, oxide layer 812 is formed over the exposed silicon between silver—gallium paste region 805 and silver-antimony paste region 808. The same process occurs in the other exposed silicon areas that exist between the silver—gallium paste regions 802–804 and silver-antimony paste regions 806–808.

5. Deposit an antireflective coating 813 (e.g., $TiO_2$ by atmospheric pressure chemical vapor deposition) on the front (side without metal contacts) of the cell. Note that the coating does not cover the metal contacts since they are on the opposite side.

6. Solder interconnect tabs to the oxide-free silver-based positive and negative electrodes to interconnect cells in a module. Following step 4, silver—gallium paste regions 802–805 are now (with the exception of the gallium which was deposited as a dopant in the expitaxial regrowth of the substrate) alloys of Ag, Si and Ga. Also following step 4, silver-antimony paste regions 806–808 are now (with the exception of the antimony which was deposited as a dopant in the expitaxial regrowth of the substrate) alloys of Ag, Si and Sb.

FIGS. 9A–D illustrate a completed IBC cell, constructed in accordance with steps 1–6 above, but utilizing aluminum to form the positive electrodes.

Figure 9A:
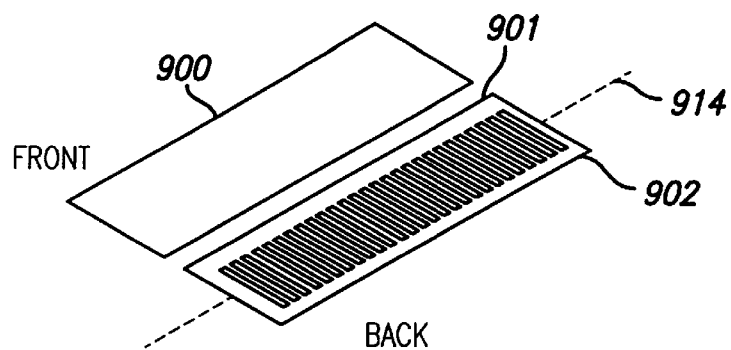
FIGS. 9A–D depict a dendritic web silicon IBC solar cell constructed in accordance with the present invention.

FIG. 9A depicts the overall structure of an IBC cell. There is a top (or light-facing) side 900 which is unobstructed by electrodes. The back side of the cell contains both the positive electrodes, which are connected together by bus bar 901, and the negative electrodes, which are connected together by bus bar 902.

Figure 9B:
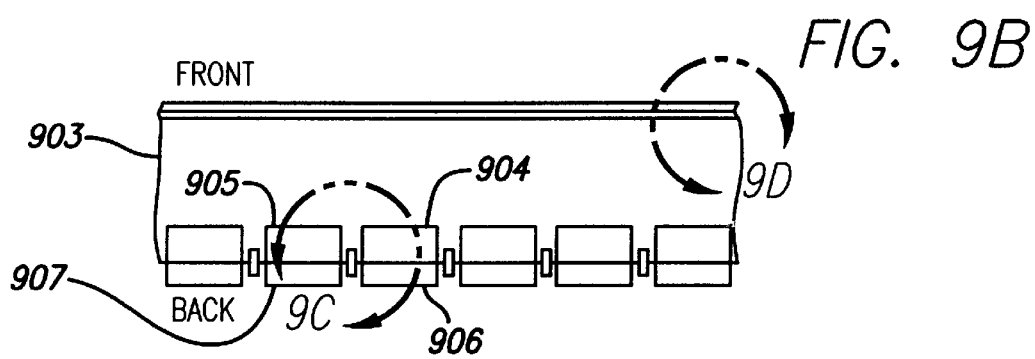
Figure 9C:
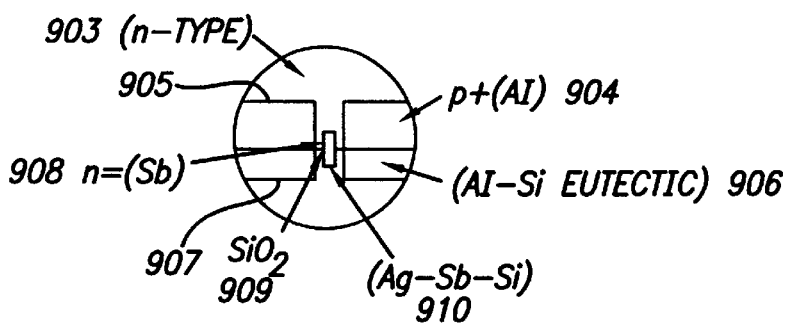

FIG. 9B depicts a cross section of the IBC cell at cut-line 914 of FIG. 9A. As can be seen in FIG. 9C, which depicts a close-up view of one region of FIG. 9B, the cross section comprises alternating wide positive electrodes of aluminum-silicon eutectic (such as 906, 907) and narrower negative electrodes of silver-silicon-antimony alloy (such as 910). Oxide has formed on the exposed silicon between the positive and negative electrodes as shown by region 909. The aluminum has positively doped the substrate 903 to create the $p^+n$ junctions, as shown by $p^+$ regions 904 and 905, while the silver-antimony has negatively doped the substrate, as shown by $n^+$ region 908.

Figure 9D:
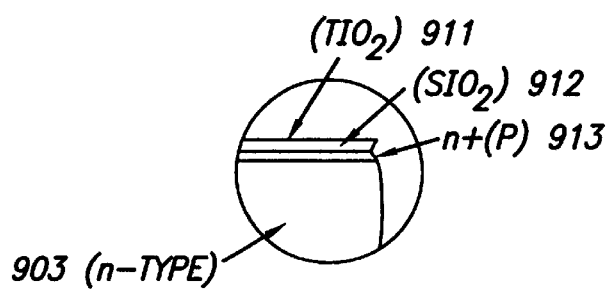

As can be seen in FIG. 9D, which depicts another close-up view of one region of FIG. 9B, the top side of the IBC cell is a layered construction, from top to bottom, of a $TiO_2$ antireflective coating 911, the $SiO_2$ passivation layer 912, the $n^+$ anti-recombination layer 913 and the n-type substrate 903.

Disadvantages, however, of using aluminum to form the positive electrodes are that the resultant aluminum-silicon eutectic contact material is not as electrically conductive as silver-silicon, the aluminum surface is not solderable and the aluminum surface is oxidized.

The process of steps 1–6 described above can also be used to guide the utilization of self-doping negative and positive electrodes in a conventional solar cell structure.

Other dopants, such as arsenic (an n-type dopant) and indium (a p-type dopant) can be considered for the silver-based system. In addition, silver may be replaced with other conductive metals which can alloy with silicon, such as tin. However, tin is not as conductive as silver and has an oxide which is present upon cooling from typical processing temperatures (≈900° C.) This suggests that a tin-based contact system would be inferior to a silver-based system with respect to series resistance and solderability.

Gold-based contacts to silicon have been used in the past. The gold-silicon eutectic temperature is low (370° C.) For solar cells, however, processing gold contacts at elevated temperatures is known to severely degrade minority carrier lifetime, the most important property in a solar cell. This means that, unlike silver, gold-based contact doping is not compatible with a simultaneous oxidation of the silicon surface since such oxidation must be done at a temperature above 800° C. At these temperatures, the gold would so greatly diffuse throughout the silicon as to severely degrade minority carrier lifetime. In addition, gold is impractical for solar cells because of its high cost.

II. Experimental Results

A study of representative materials systems for the above-disclosed invention has been undertaken. Included in the study are: the use of a variety of deposition methods (sputtering or screen printing), the use of a variety of high temperature processes (rapid thermal processing or belt furnace processing with radiant heating), characterization of the materials produced (determining composition of the epitaxially regrown silicon layer and microscopy for evidence of alloying) and electrical characterization (current-voltage curve determination for a simulated contact and determination of contact material resistivity). The results confirm that the present invention is suitable for forming self-doping contacts for a variety of silicon devices, and is particularly appropriate for a low-cost, high performance interdigitated back contact solar cell structure as disclosed. These results of this study are presented below.

II. A. Results of Sputtering

II. A. 1. Construction of the Test Structures

Metal films containing the n-type dopant Sb were sputtered onto lightly-doped ($1\times10^{15}$ cm$^{-3}$) n-type CZ silicon wafers (3-inch diameter, <111> orientation, phosphorus-doped to 3–15 Ω-cm, 13–17 mils thick). The requested compositions of the sputtering targets were 95% Ag-5% Sb, and 93% Ag-2% Ti-5% Sb (by weight). (However, the measured composition of the film deposited from the A—Sb target was found to be 98.9% Ag and 1.1% Sb (by weight) rather than the 95% Sb and 5% Ag desired, as discussed below.) The nominal thicknesses for the Ag—Sb and the Ag—Ti—Sb films were 1.6 and 1.2 μm, respectively. Sputtering was done in an ULVAC RFS-200 unit. Before sputtering commenced, the chamber was pumped to a pressure below $5.0\times10^{-6}$ Torr Sputtering was done in an atmosphere of pure Ar at a pressure of 1 Pa ($7.5\times10^{-3}$ Torr) and a power of 150 W with a substrate to target distance of 40 mm. For Ag—Sb and Ag—Ti—Sb, the sputtering time was 25 min and the substrates were heated to 300° C. in an attempt to achieve improved adhesion between the sputtered film and the wafer substrate.

In order to test the electrical characteristics of the contact formed, by the present invention, on the front of the wafers, a phosphorus liquid dopant (Filmtronics P-507, undiluted) was spun on the back of the wafers. The wafers were then heat-treated in an AG Associates HeatPulse NMG-01 rapid thermal processing (RTP) unit at a temperature of 900° C. or 950° C. in pure Ar for two minutes. The purpose of the heat treatment was to alloy the primary metal (Ag) on the front of the wafer with the silicon, and to diffuse phosphorus dopant into the back of the wafers simultaneously.

The alloyed front metal was protected with photoresist while the back diffusion glass was etched in HF. Upon removal of the photoresist, a metal contact is formed by evaporating the layers Ti/Pd/Al (0.05/0.05/2.0 μm) on the back. The Ti layer is evaporated first such that it makes direct contact with the Si, followed by the Pd and then Al. The desired final test structure therefore, from top to bottom, comprises the following layers: i) front metal and silicon alloy (formed from the Sb-doped metal alloy of the present invention which has formed a eutectic alloy with the silicon), ii) the n$^+$ region (formed from Sb, of the Sb-doped metal alloy of the present invention, doping the liquid phase expitaxially regrown Si), iii) the n-type substrate made n-type from the light phosphorous doping of the original wafer, iv) the n$^+$ region (formed from the phosphorous spun-on dopant) and v) the back metal layered contact (the evaporated Ti/Pd/Al).

For a test wafer, the composition of its as-deposited Sb-doped metal alloy film, sputtered from a nominal 95% Ag-5% Sb target, was measured using the electron probe for microanalysis (EPMA) technique. The concentration of Sb was found to be only 1.1% (by weight) in the film rather than the 5% expected. This discrepancy may be due to the sputtering target being deficient in Sb or it may be due to the sputtering yield for Sb being considerably less than that for Ag. Since the concentration of Sb in the as-deposited film was less than specified, the concentration of Sb remaining in the epitaxially regrown Si, following alloying, will also be correspondingly less. Ag comprised the balance of the as-deposited film at 98.9% (by weight).

During the RTP processing of several wafers, the Ag—Sb or Ag—Ti—Sb metal had a tendency to ball up into small metal islands or "dots" so the contact was not uniform. However, large areas of continuous contact were produced as well. These continuous contact areas, which are reasonably uniform in thickness, are as large as 1 cm$^2$. In retrospect, that balling up occurs is not surprising, since the phase diagram for Ag—Sb (FIG. 4) shows, for example, that a 5% (weight) Sb composition begins to melt at 790° C. and is completely melted at 920° C. The Ag—Si eutectic is not formed until 830° C. Since the RTP processing for Ag—Sb or Ag—Ti—Sb was done at 900° C. or 950° C., the contact metal may well have melted and balled up by surface tension before appreciable interaction between metal and silicon substrate had occurred.

Where dots were formed, as opposed to the large continuous areas, the lateral dimensions of the metal islands, or "dots," of the Ag—Sb samples often ranged from 200 to 700 μm, comparable to the thickness of the wafer (360 μm), and the dots were about 15 μm thick. Since the initial Ag—Sb metal thickness was 1.6 μm, a 15 μm equivalent thickness of the dots in certain regions of the substrate after alloying suggests that these regions have approximately 11% of their area covered with metal dots, with the remaining 89% devoid of metal.

Optical images at 100× of the Ag—Sb or Ag—Ti—Sb metal dots clearly showed that these contact metals had interacted with the silicon substrate. The boundaries of the metal dots frequently had triangular or hexagonal shapes, reflecting the influence of the <111> silicon surface.

Samples where contacts are in the form of isolated dots were studied in greater detail than the larger continuous areas since the areas of contact and of non-contact are well-defined for dots.

II. A. 2. Determining Dopant Concentrations

Figure 10:
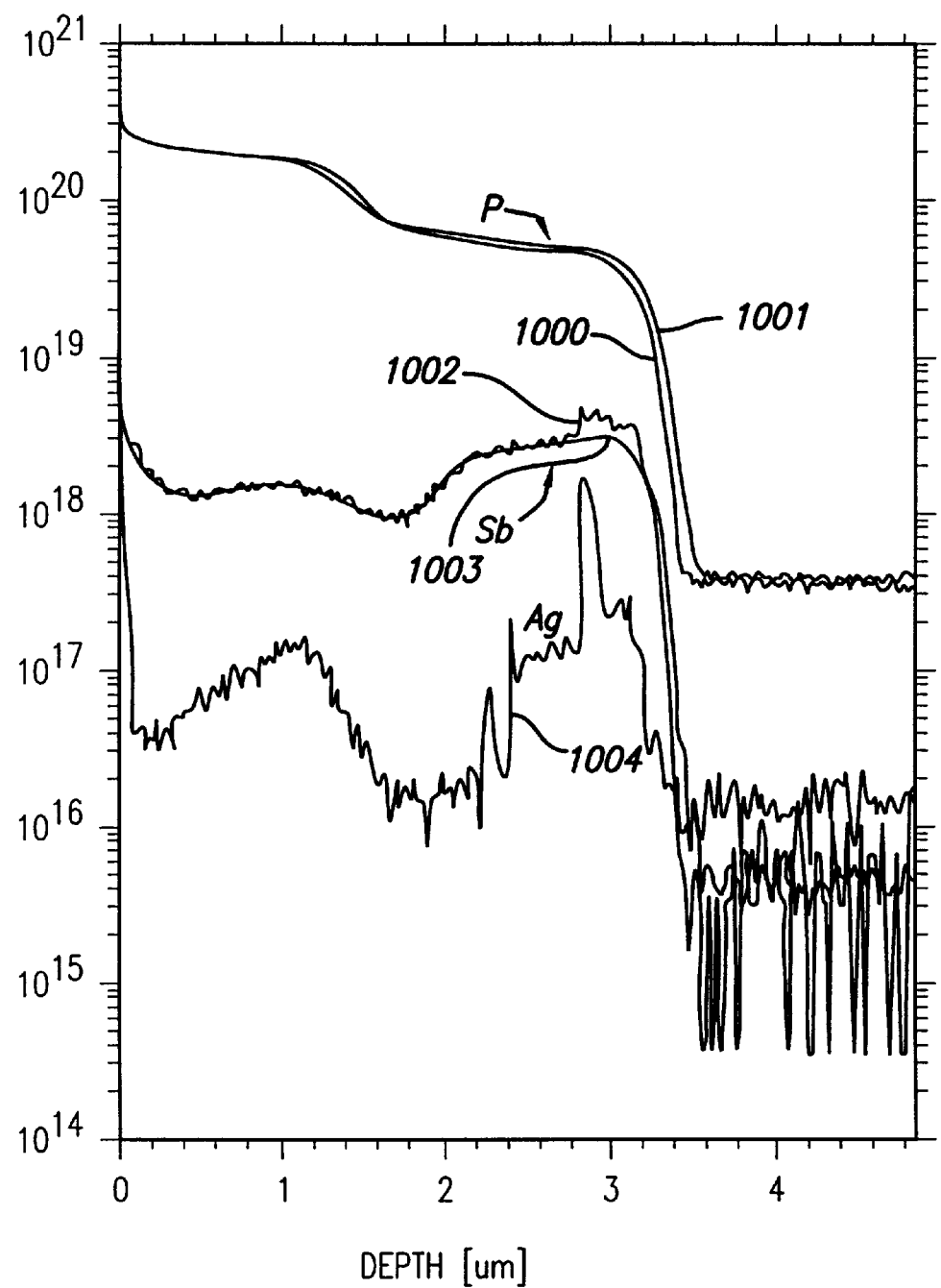
FIG. 10 illustrates several curves of dopant concentration produced by dots formed in accordance with the present invention, as a function of depth, measured utilizing the secondary ion mass spectroscopy technique.

Certain of the alloyed Ag—Sb dots were removed by chemical etching, and the composition of the underlying expitaxially regrown Si was measured from the silicon surface to a depth of approximately 5 μm by the secondary ion mass spectroscopy (SIMS) technique. The results are shown in FIG. 10. Two nearly superimposed curves are shown for Sb and for P (phosphorous). Curves 1001 for P and 1002 for Sb represents detection of the ion itself (e.g., Sb), while the curves 1000 for P and 1003 for Sb represent detection of the molecular ion (e.g., Sb+Si). Silver is also present and is represented by curve 1004. The vertical scale of FIG. 10 is dopant concentration in atoms/cm$^3$, while the horizontal scale is depth from the silicon surface in microns. As can be seen, the depth of the regrown silicon layer is about 3.4 $\mu$m since this is the depth at which all of the dopant concentrations drop off precipitously. This implies a metal dot height of 18 $\mu$m (3.4 $\mu$m/0.19), when calculated from Equation (1), which is in fact approximately the height observed.

The SIMS profile indicates an average Sb concentration of approximately $2 \times 10^{18}$ cm$^{-3}$ throughout the regrown region. This value is a factor of 5 less than the desired minimum value of $1 \times 10^{19}$ cm$^{-3}$ required for an ohmic contact to n-type silicon. However, the concentration of Sb in the sputtered film (as discussed above) was also less than desired by a factor of five (1.1% rather than 5%, by weight). This means that a metal film having the desired concentration of Sb (5%, by weight) would produce a doping concentration sufficient for good ohmic contact ($1 \times 10^{19}$ cm$^{-3}$). Thus, the SIMS data support this approach for producing a self-doping negative contact to silicon.

An unexpected result from the SIMS profile is the high concentration of P ($4 \times 10^{19}$ cm$^{-3}$ to $2 \times 10^{20}$ cm$^{-3}$) in the regrown silicon layer. The source of this P must be the liquid dopant that was spun onto the opposite side of the wafer, as described above. The P dopant was applied to promote ohmic contact to the back side of the wafer (P diffusion into the back side of the wafer was intended to occur simultaneously with the alloying between Si and Ag—Sb on the front) so that the current-voltage characteristic of the Ag—Sb to Si contact could be measured. It appears that some of the P from that doped layer was transported during the RTP process around to the front of the wafer where it was absorbed by the metal and incorporated into the Si. The original doping of the Si substrate with P was light ($1 \times 10^{15}$ cm$^{-3}$ as determined by spreading resistance dopant measurements discussed below), and could not have been a source for the large amount of P detected by SIMS. The surface of the Si beside the metal dot was also doped to a limited extent ($7 \times 10^{16}$ cm$^{-3}$ surface concentration, as indicated by spreading resistance measurements also discussed below), but this is a factor of more than 1000 less than the P doping found in the regrown layer. Thus, the regrown layer was found to be more than adequately doped for ohmic contact, but only 2% of the dopant atoms are Sb, while 98% are P.

Although this doping with P was unintended and unexpected, it could be exploited as an alternative means for creating a self-doping contact.

To summarize, the above-described process for doping with P to create a self-doping n$^+$ contact to n-type silicon is as follows:

1. Apply P dopant (a spun-on liquid dopant is described above, but other methods, such as a screen-printable paste, would be expected to work as well) to the front side of an n-type silicon substrate and dry.
2. On the back side of the silicon substrate, in those regions where an n$^+$ contact is desired, apply Ag (sputtered Ag is described above, but other methods, such as a screen-printable Ag paste, would be expected to work as well) and place the substrate into a heating furnace. While a mixture, by weight, of 1.1% Sb and 98.9% Ag was actually applied in the process described above, it is expected that the presence of Sb was irrelevant with respect to the process described here by which P acts as a dopant.
3. Raise the temperature of the silicon substrate, which is surrounded by an ambient gas of the heating furnace, to a value where the Ag alloys with the silicon and where the P dopant evaporates. The ambient gas utilized above is pure Ar, however other inert gases would be expected to be acceptable. Furthermore, depending upon whether oxidation of the exposed silicon surfaces is desired, oxygen could be mixed into the ambient gas. The heating temperature described above is either 900° C. or 950° C., but temperatures in a range of 850° C. to 1000° C. are expected to be acceptable. The evaporated P atoms mix with the ambient gas of the heating furnace and some of them travel to the molten Ag where they are absorbed by the Ag.
4. The temperature is held long enough to allow an adequate quantity of dopant atoms to be absorbed by the Ag, but not so long as to allow the silicon surface adjacent to the Ag to absorb a significant quantity of dopant atoms. In the above-described process, the heating time was two minutes.
5. The temperature of the silicon substrate is then lowered below the Ag—Si eutectic temperature and as the Si resolidifies, through liquid phase expitaxy, dopant P atoms are incorporated into the reformed lattice.

This 5-step process can be generalized as a process for creating a self-doping n$^+$contact to silicon as follows:

1. On a first side of a silicon substrate, in those regions where an n$^+$ contact is desired, apply Ag and place the substrate into a heating furnace;
2. Raise the temperature of the silicon substrate, which is surrounded by an ambient gas of the heating furnace, to a value above the Si—Ag eutectic temperature in order that the Ag forms a molten alloy with the silicon.
3. Introduce a source of P vapor into the ambient gas of the heating furnace;
4. The vaporized P atoms then mix with the ambient gas of the heating furnace and some of them travel to the molten Ag where they are absorbed by the molten Ag—Si mixture to a much greater degree than they are absorbed by the surfaces of solid Si;
5. The temperature is held long enough to allow an adequate quantity of dopant atoms to be absorbed by the Ag, but not so long as to allow the silicon surface adjacent to the Ag to absorb a significant quantity of dopant atoms; and
6. The temperature of the silicon substrate is then lowered below the Ag—Si eutectic temperature and as the Si resolidifies, through liquid phase expitaxy, dopant P atoms are incorporated into the reformed lattice.

The above process can be generalized even further. While P is used as the dopant source, dopant atoms from Group III of the Periodic Table (such as boron, gallium or indium) could be used to create a positive contact while dopant atoms from Group V (such as arsenic or antimony in addition to phosphorus) could be used to create a negative contact. While Ag is described as the contact metal, other metals (such as tin) would also be expected to work. The method of application of the metal to the silicon surface could be any one of several methods, including evaporation, sputtering or screen printing.

An IBC structure could be formed by the following steps:

1. Apply P dopant (e.g., using a liquid dopant or a screen-printable paste) to the front side of an n-type silicon substrate and dry;

2. Screen-print Ag grid lines on the back of the substrate and dry;
3. Raise the temperature to approximately 850° C. to 1000° C. (above the Ag—Si eutectic temperature of 830° C.) for several minutes to simultaneously: i) create the desired n⁺ layer on the front, ii) create a molten mixture of Ag and Si, and iii) have some of the P from the front dopant source be absorbed by the molten Ag on the back;
4. Lower the temperature below the Ag—Si eutectic temperature such that the P atoms are incorporated into the regrown Si layer so as to enable an ohmic contact;
5. Strip the diffusion glass created by the P dopant on the front side by immersing the substrate in hydrofluoric acid;
6. Screen-print a self-doping positive contact metal (e.g., Al or Ag—Ga) on the back between the Ag in an interdigitated manner;
7. Raise the temperature to approximately 850° C. to 1000° C. (above the Al—Si or Ag—Si eutectic depending upon which self-doping positive electrode is used) for several minutes, in an inert ambient gas with some oxygen, to simultaneously: i) create the silicon oxide surface passivation layer and ii) create a molten mixture of Al and Si or Ag and Si;
8. Lower the temperature below the eutectic temperature to simultaneously form: i) a p⁺n junction and ii) a positive contact of the solar cell; and
9. Deposit an anti-reflective coating on the front surface.

The key idea in all the above sequences is that a conventional source of P dopant can supply P dopant selectively to the Ag contact material. Such a process is expected to form a self-doping negative contact without excessively doping the silicon surface adjacent to the negative contact. In this way, standard materials are utilized (liquid P dopant, Ag screen-printable paste) and a low shunt resistance between negative and positive contacts is avoided.

With respect to measuring dopant concentrations in the test structures described in II. A. 1 CONSTRUCTION OF THE TEST STRUCTURES, the technique of spreading resistance was used in addition to the SIMS technique described above. The total Sb and P dopant concentration at the silicon surface was measured by spreading resistance for three dots on a wafer alloyed with Ag—Sb at 950° C. for 2 minutes, and also for three dots on a wafer alloyed with Ag—Sb at 900° C. for 2 minutes. The front metal (Ag—Sb) as well as the back metal (Ti/Pd/Al) was removed by immersing a sample into concentrated $HNO_3$ for approximately 30 minutes. Areas of the silicon surface which had been previously covered with Ag—Sb metal were uncovered.

Figure 11:
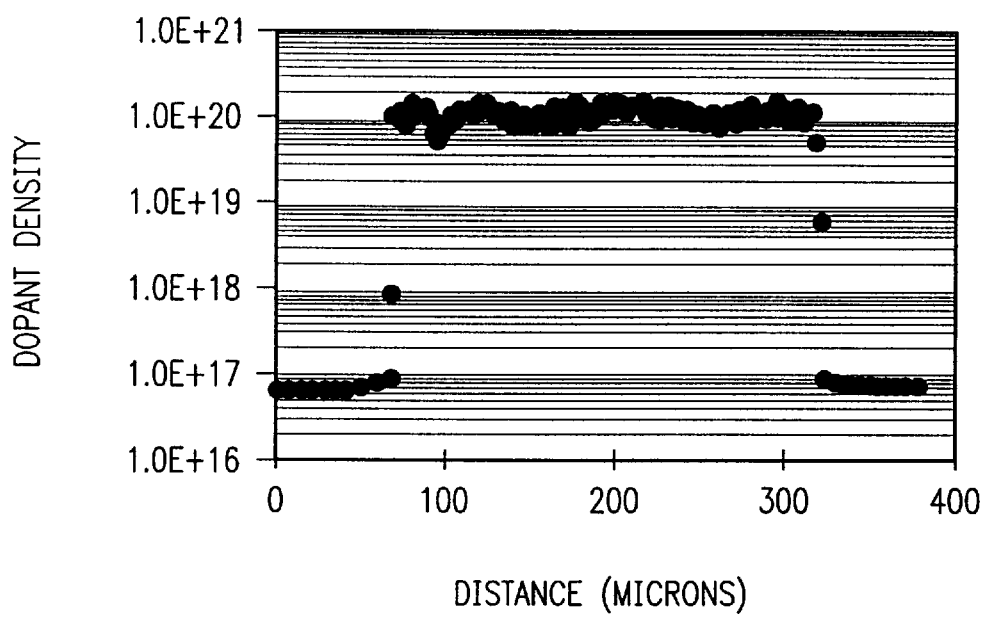
FIG. 11 depicts total dopant density produced by dots formed in accordance with the present invention, as a function of lateral distance, measured utilizing the spreading resistance technique.

Spreading resistance scans of such a silicon area gave a total surface doping concentration of approximately $7 \times 10^{16}$ dopant_atoms/cm³ beside the dot and of approximately $1 \times 10^{20}$ dopant_atoms/cm³ beneath the dot, as shown in FIG. 11 for a representative dot. The vertical axis of FIG. 11 shows doping concentration in atoms/cm³ (ranging from $1 \times 10^{16}$ to $1 \times 10^{21}$ atoms/cm³) while the horizontal axis is distance scanned across the silicon surface in microns. These spreading resistance results indicate that the measured surface concentration in the region previously covered with the Ag—Sb metal dot exceeded the value of $1 \times 10^{19}$ dopant_atoms/cm³ required for ohmic contact. This is consistent with the low value of contact resistance inferred from the I-V measurements, as discussed below. Note that the measured dopant concentration beneath the dot as measured by spreading resistance agrees well with the dopant concentration measured by SIMS and shown in FIG. 10.

The fact that the silicon surface beside the metal dot is more than three orders of magnitude lower in dopant concentration than the silicon surface beneath the metal dot shows that the dopant was transported into the silicon by the metal.

Spreading resistance was also done for a beveled wafer sample. The doping density of the substrate was measured to be $1 \times 10^{15}$ dopant_atoms/cm³, which corresponds to a resistivity of 5 Ω-cm, in good agreement with the 4.3 Ω-cm value measured for the starting wafer. Note that the measured surface concentration beside the metal dot was approximately 70 times greater than the substrate doping. This may indicate a tendency of the solid Si to absorb P in the gaseous state, although the solid Si absorbs gaseous P to a much lesser extent than the molten metal.

II. A. 3. Electrical Measurements

Resistivity of the contact material itself (the Ag, Sb and Si alloy which is mostly Ag) is important because this parameter determines how large the solar cell contacts must be in order to carry the photogenerated current without undue ohmic losses. This resistivity was measured for two dots (15 μm equivalent thickness), on a wafer where Ag—Sb was sputtered and then processed at the 950° C. alloying temperature, to be 7±1 μΩ-cm. This compares favorably with the resistivity measured, on a particular wafer, of the as-deposited Ag—Sb film of 6.9 μΩ-cm. This resistivity of the contact material also compares favorably with the resistivity measured, on another wafer, of the as-deposited Ag—Ti—Sb film of 4.8 μΩ-cm. This suggests that little or no degradation in electrical resistivity results from alloying with the silicon substrate, probably because most of the contact material is Ag (95.5% by weight as indicated by FIG. 3). For purposes of comparison, the handbook value of resistivity for bulk Ag is 1.6 μΩ-cm.

Figure 12:
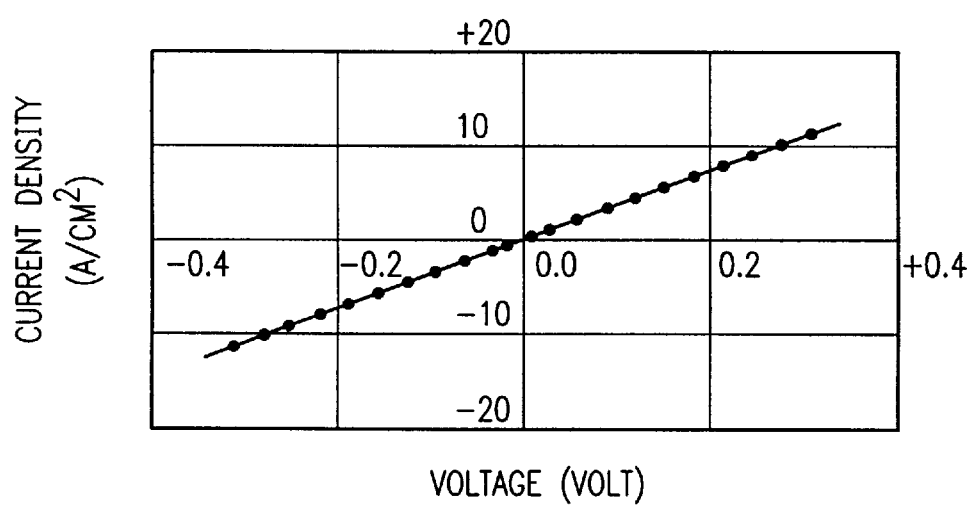
FIG. 12 renders a linear and therefore ohmic I-V curve measured for dot contacts formed in accordance with the present invention.

It was possible to make electrical contact to individual dots of Ag—Sb or Ag—Ti—Sb using a probe station. Current-voltage (I-V) curves were measured to determine if the dot contact was ohmic (linear I-V) or rectifying (non-linear I-V). The resultant I-V curves, such as the representative one of FIG. 12, were highly linear at current densities up to the highest values measured (±11 A/cm²), thereby indicating ohmic behavior for the Ag—Sb contacts (with ten dots measured). The vertical axis of FIG. 12 is current density (ranging from −20 A/cm² to +20 A/cm²) and the horizontal axis is voltage (ranging from −0.4 volts to +0.4 volts). The Ag—Sb dot of FIG. 12 was processed at 900° C. for 2 minutes, has an area of $0.89 \times 10^{-3}$ cm² and a normalized resistance of 0.028 ohm-cm². A current density of 11 A/cm² is approximately 30 times as large as typical current densities that must be carried by solar cells under one sun illumination. Since Ag is not a dopant in Si, the Sb in the Ag (augmented by the P from the liquid dopant layer) apparently was able to dope the underlying Si n-type to give the desired ohmic contact.

In particular, dot resistances measured with a probe station ranged from 10 to 71Ω for the Ag—Sb samples, with such resistances corresponding to dot contact areas ranging from $1.9 \times 10^{-3}$ to $0.4 \times 10^{-3}$ cm². The probe station measured resistance through a circuit which flows through all layers of the test structure (as described previously): i) Ag—Sb dot alloyed in eutectic proportions with silicon, ii) the n⁺ region below the dot (formed from Sb, of the Sb-doped metal alloy of the present invention, and from P of the back dopant source layer, doping the liquid phase expitaxially regrown Si), iii) the n-type substrate made n-type from the light phosphorous doping of the original wafer, iv) the n⁺ region (formed from the phosphorous spun-on dopant) covering the entire back of the wafer and v) the back metal layered contact (the evaporated Ti/Pd/Al) also covering the entire back of the wafer. Of these layers, the only significant sources of resistance are: i) the contact resistance between the Ag—Sb—Si dot and its underlying n⁺ region, and ii) the resistance of the n-type substrate. The product of resistance and area for the dots had an average and standard deviation of 0.026±0.007 $\Omega$-cm². This resistance-area product is instructively compared to the product of silicon wafer resistivity (a value of 3.7 $\Omega$-cm determined previously) and its thickness (0.0365 cm) which gives a resistance-area product of 0.135 $\Omega$-cm².

The resistance-area product of the dots is lower than that of the substrate-alone (it is about 20% of the substrate's value) due to the differences in current flow geometries. The substrate value of 0.135 $\Omega$-cm² is based upon current flow, in the relevant area, being between two equal-sized planar contacts. The dot value of 0.026±0.007 $\Omega$-cm² is based upon the current flow spreading out from a relatively point-sized dot on the front of the wafer to the large planar metal contact (the evaporated Ti/Pd/Al) covering the entire back of the wafer. In fact, finite element calculations were done to determine the resistance-area product of the substrate alone for current flow geometries similar to that of the dots. These calculations determined the resistance-area product of the substrate alone to be virtually the same as that measured for the dots. These results strongly suggest that the contact resistance between the Ag—Sb—Si dot and its underlying n⁺ region is quite low—as a crude upper bound we can reasonably assume that the contact resistance is less than 10% of the measured specific resistance of the dot, i.e., <3 m$\Omega$-cm².

II. B. Screenprinting of Pastes

As an alternative to sputtering for the application of the Ag—Sb alloy, a paste was prepared comprising Ag particles and Sb particles, approximately 10 $\mu$m in size, and mixed according to the ratio 95% Ag-5% Sb, by weight. This mixture of particles was combined with the appropriate organic binders and solvents to form a paste suitable for screen printing. Each of the silicon wafers utilized had a pre-diffused n-type layer of a particular dopant concentration. As a rough guide to n-dopant concentration, the sheet resistances of the wafers' pre-diffuse n-type layers were of approximately three different values: 35, 80, and 500 $\Omega$/□ (with a higher value of $\Omega$/□ indicating lower dopant concentration). A test pattern, of the transmission line method, of parallel metal stripes was printed onto the pre-diffused n-type surface of the silicon wafers (such wafers having no dopant, such as P, on their opposite side as had been the case in the above section II. A. RESULTS OF SPUTTERING) and fired in a belt furnace with radiant heating at 950° C. for two minutes. The metal stripes were found to be 14 $\mu$m thick, continuous, have a resistivity of approximately 21 $\mu\Omega$-cm, were reasonably adherent to the Si substrate and did not alloy with the Si substrate.

The transmission line method metal test pattern enabled a measurement of specific contact resistances (between the Ag—Sb metal stripes and their underlying n⁺ regions) of 10, 15, and 68 m$\Omega$-cm², respectively, for a representative sample following the 950° C. step. After a subsequent forming gas anneal (3 standard liters per minute flow of 10% hydrogen and 90% nitrogen at 400° C. for 15 minutes in a conventional quartz tube furnace), the contact resistance values dropped by about a factor of six to 1.9, 2.2, and 10 m$\Omega$-cm², respectively. Contact resistance values below approximately 50 m$\Omega$-cm² are suitable for contacts to solar cells designed to operate under normal (unconcentrated) sunlight conditions. Although contact resistance values, for screen printed metal paste to wafers with no pre-diffused n-type layer, were not satisfactory, the above results show that continuous and adherent metal contacts can be achieved by screen printing of a paste and belt furnace firing.

Analysis of the samples also appears to indicate that this paste, of separate Ag and Sb granules, does not alloy with the silicon. However, it does appear that the paste creates a very thin n⁺ layer, localized around individual Sb granules, accounting for the enhanced ohmic contacts achieved when the underlying substrate has already been sufficiently doped. This type of paste does not appear to be suitable for creating a junction.

A preferable screen printing paste would be based on particles where each particle is itself an alloy composition of 95% Ag-5% Sb by weight, rather than the separate Ag particles and Sb particles as used here. It is anticipated that such a paste would alloy with the silicon and form a heavily doped region in a manner similar to the results discussed above in section II. A. RESULTS OF SPUTTERING.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. A solar cell, comprising:

a rectifying junction, at least partially exposable to solar radiation for generation of electrical current, made of a first semiconductive material, comprising a first half and a second half;

a first electrode making ohmic contact to the first half;

a second electrode making ohmic contact to the second half;

wherein the first half has been doped with a first dopant to be a semiconductive material of a first type;

wherein the second half has been doped with a second dopant to be a semiconductive material of a second type opposite to the first type;

wherein the second half comprises a first region beneath the second electrode that has been more heavily doped with a third dopant than at least a portion of the remaining second half;

wherein the first region is aligned with the second electrode;

wherein the second electrode comprises an alloy of a first metal, the third dopant and the first semiconductive material;

wherein the first metal is capable of forming a eutectic with the first semiconductive material and the first metal is not capable of significantly doping the first semiconductive material; and wherein that part of the second electrode that comprises the first metal and the first semiconductor comprises eutectic proportions of the first metal and the first semiconductive material.

2. The solar cell of claim 1, wherein the first metal of the second electrode is in proportion to a total of the third dopant of the second electrode and the third dopant of the first region, such that an alloy comprising the proportion of the first metal to the total of the third dopant is capable of existing as a solid, of single uniform phase, in a first temperature range, and transitions directly to a liquid phase at a second temperature range, wherein the second temperature range is immediately above the first temperature range.

3. The solar cell of claim 1, wherein the first dopant is antimony.

4. The solar cell of claim 1, wherein the first dopant is gallium.

5. The solar cell of claim 1, wherein the first dopant is phosphorous.

6. The solar cell of claim 1, wherein the first dopant is a Periodic Table Group III element.

7. The solar cell of claim 1, wherein the first dopant is a Periodic Table Group V element.

8. The solar cell of claim 1, wherein the third dopant is selected from the group consisting of a Periodic Table Group III element.

9. The solar cell of claim 1, wherein the third dopant is selected from the group consisting of a Periodic Table Group V element.

10. The solar cell of claim 1, wherein the first metal is silver.

* * * * *

UNITED STATES PATENT AND TRADEMARK OFFICE
CERTIFICATE OF CORRECTION

PATENT NO. : 6,180,869 B1
DATED : January 30, 2001
INVENTOR(S) : Daniel L. Meier et al.

It is certified that error appears in the above-identified patent and that said Letters Patent is hereby corrected as shown below:

Title page,
The title page, showing the illustrative figure, should be deleted and substitute therefore the attached title page.

Drawings,
Figs. 1, 3, 7, 8D, 8E, 9B, 9C, 9D, 10 and 11 should be deleted to be replaced with the drawings consisting of Figs. 1, 3, 7, 8D,8E, 9B, 9C, 9D, 10 and 11, as shown on the attached pages.

(12) United States Patent
Meier et al.

(10) Patent No.: US 6,180,869 B1
(45) Date of Patent: Jan. 30, 2001

(54) METHOD AND APPARATUS FOR SELF-DOPING NEGATIVE AND POSITIVE ELECTRODES FOR SILICON SOLAR CELLS AND OTHER DEVICES

(75) Inventors: Daniel L. Meier; Hubert P. Davis, both of Pittsburgh, PA (US)

(73) Assignee: Ebara Solar, Inc., Large, PA (US)

( * ) Notice: Under 35 U.S.C. 154(b), the term of this patent shall be extended for 0 days.

(21) Appl. No.: 09/072,411

(22) Filed: May 4, 1998

Related U.S. Application Data

(60) Provisional application No. 60/045,673, filed on May 6, 1997.

(51) Int. Cl.$^7$ ............................................. H01C 31/0224
(52) U.S. Cl. ............................................. 136/256; 257/461
(58) Field of Search ....................................... 136/256, 261, 136/262; 257/461

(56) References Cited

U.S. PATENT DOCUMENTS

| | | | |
|---|---|---|---|
| 2,998,334 | 8/1961 | Bakalar | 148/1.5 |
| 3,112,230 | 11/1963 | Rudenberg | 136/89 |

(List continued on next page.)

FOREIGN PATENT DOCUMENTS

| | | |
|---|---|---|
| 39452 | 2/1970 | (AU) . |
| 2939541A1 | 4/1981 | (DE) . |
| 1540917 | 10/1968 | (FR) . |
| 1416964 | 12/1975 | (GB) . |
| WO 97/13280 | 4/1997 | (WO) . |

OTHER PUBLICATIONS

V.N. Vysotskii et al., "Photovoltaic Cells With Aluminum Alloy Contacts And A Base Partially Doped With Lithium", Geliotekhnika, vol. 27, No. 3, pp. 16–19, Jan. 1, 1991, UDC 621.383.51:537.221.

(List continued on next page.)

*Primary Examiner*—Ellis Robinson
*Assistant Examiner*—Michael Miggins
(74) *Attorney, Agent, or Firm*—Squire, Sanders & Dempsey L.L.P.

(57) ABSTRACT

A self-doping electrode to silicon is formed primarily from a metal (major component) which forms a eutectic with silicon. A p-type dopant (for a positive electrode) or an n-type dopant (for a negative electrode) is alloyed with the major component. The alloy of major component and dopant is applied to a silicon substrate. Once applied, the alloy and substrate are heated to a temperature above the major component-silicon eutectic temperature such that the major component liquefies more than a eutectic proportion of the silicon substrate. The temperature is then decreased towards the eutectic temperature permitting molten silicon to reform through liquid-phase epitaxy and while so doing incorporate dopant atoms into its regrown lattice. Once the temperature drops below the major component-silicon eutectic temperature the silicon, which has not already regrown into the lattice, forms a solid-phase alloy with the major component and the remaining unused dopant. This alloy of major component, silicon and unused dopant is the final contact material. Alternatively, a self-doping electrode may be formed from an unalloyed metal applied to a silicon substrate. The metal and substrate are heated to a temperature above the metal-silicon eutectic temperature in an ambient gas into which a source of vaporized dopant atoms has been introduced. Dopant atoms in the ambient gas are absorbed by the molten mixture of metal-silicon to a much greater extent than they are absorbed by the solid silicon substrate surfaces. The temperature is then decreased to below the metal-silicon eutectic temperature. During this temperature decrease, the doped regrown silicon layer and the metal-silicon alloy final contact material are created in the same process as described above.

10 Claims, 9 Drawing Sheets

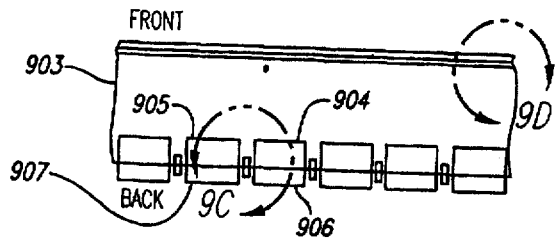

UNITED STATES PATENT AND TRADEMARK OFFICE
CERTIFICATE OF CORRECTION

PATENT NO. : 6,180,869 B1
DATED : January 30, 2001
INVENTOR(S) : Daniel L. Meier et al.

It is certified that error appears in the above-identified patent and that said Letters Patent is hereby corrected as shown below:

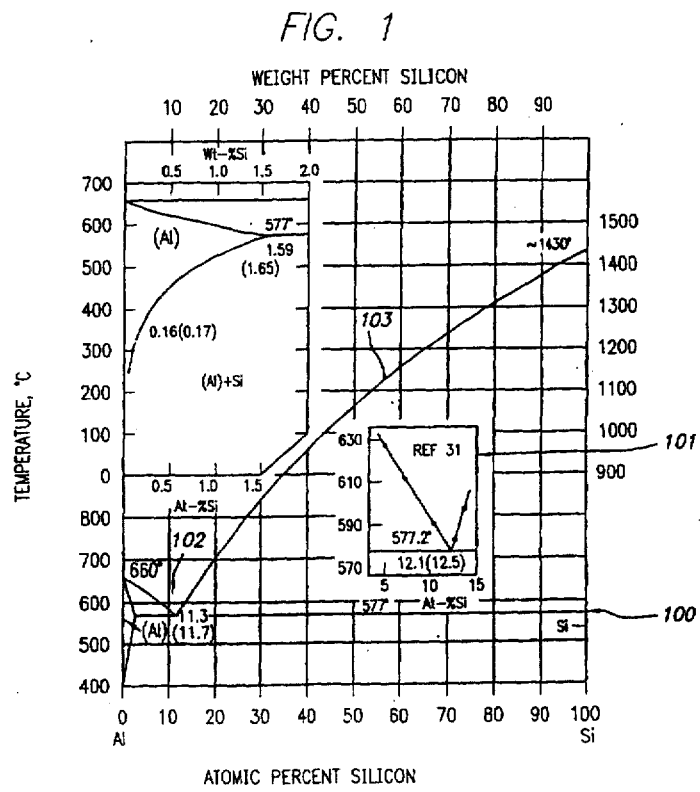

FIG. 1

UNITED STATES PATENT AND TRADEMARK OFFICE
CERTIFICATE OF CORRECTION

PATENT NO. : 6,180,869 B1
DATED : January 30, 2001
INVENTOR(S) : Daniel L. Meier et al.

It is certified that error appears in the above-identified patent and that said Letters Patent is hereby corrected as shown below:

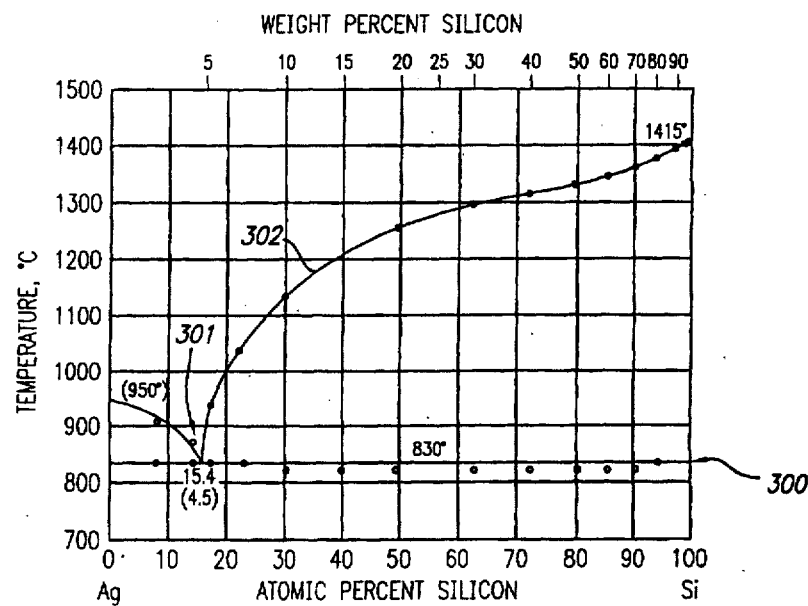

FIG. 3

UNITED STATES PATENT AND TRADEMARK OFFICE
CERTIFICATE OF CORRECTION

PATENT NO. : 6,180,869 B1
DATED : January 30, 2001
INVENTOR(S) : Daniel L. Meier et al.

It is certified that error appears in the above-identified patent and that said Letters Patent is hereby corrected as shown below:

FIG. 7

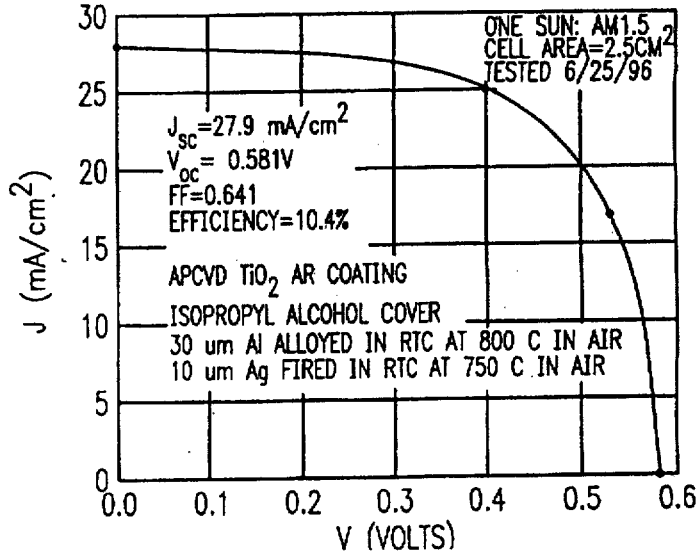

UNITED STATES PATENT AND TRADEMARK OFFICE
CERTIFICATE OF CORRECTION

PATENT NO. : 6,180,869 B1
DATED : January 30, 2001
INVENTOR(S) : Daniel L. Meier et al.

It is certified that error appears in the above-identified patent and that said Letters Patent is hereby corrected as shown below:

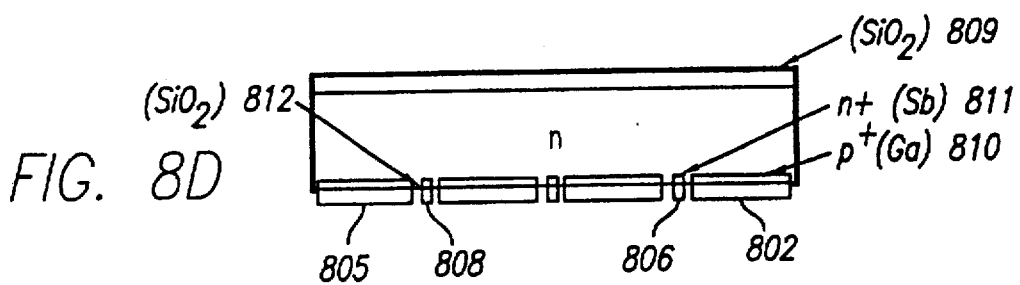

FIG. 8D

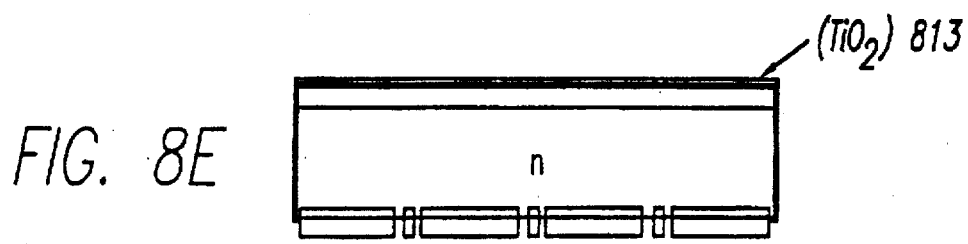

FIG. 8E

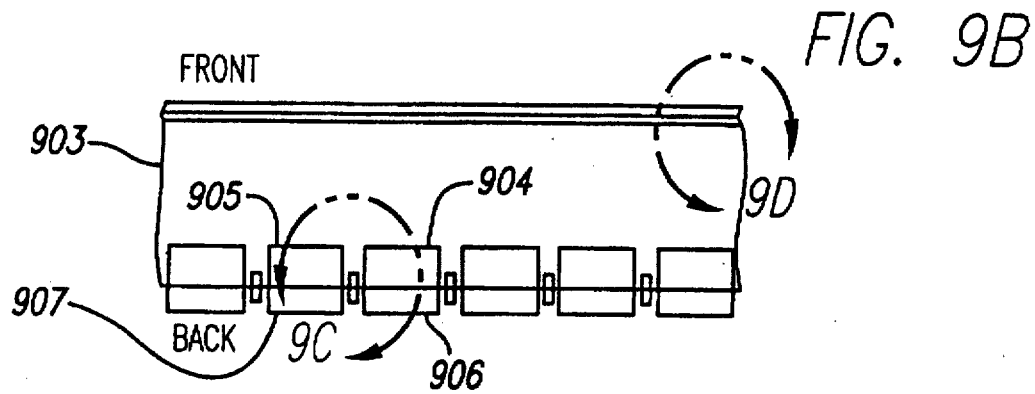

FIG. 9B

UNITED STATES PATENT AND TRADEMARK OFFICE
CERTIFICATE OF CORRECTION

PATENT NO.    : 6,180,869 B1
DATED         : January 30, 2001
INVENTOR(S)   : Daniel L. Meier et al.

It is certified that error appears in the above-identified patent and that said Letters Patent is hereby corrected as shown below:

FIG. 9C

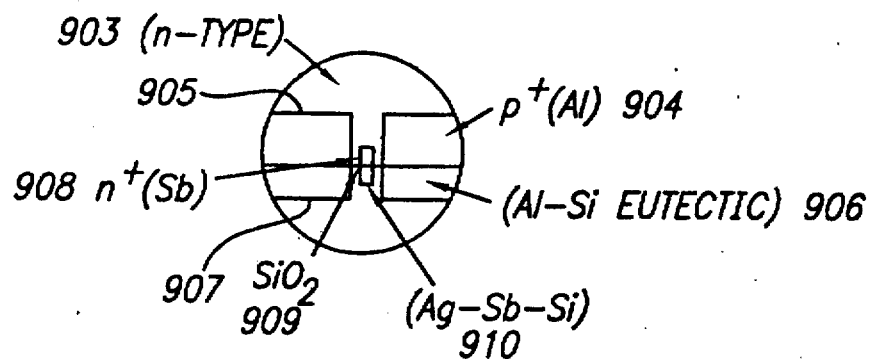

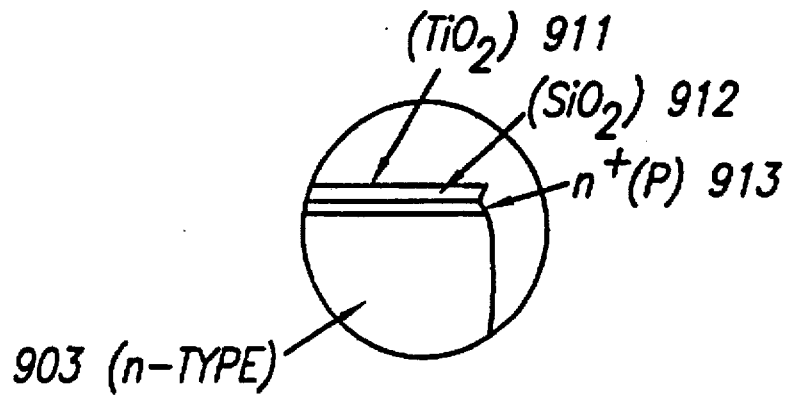

FIG. 9D

UNITED STATES PATENT AND TRADEMARK OFFICE
CERTIFICATE OF CORRECTION

PATENT NO. : 6,180,869 B1
DATED : January 30, 2001
INVENTOR(S) : Daniel L. Meier et al.

It is certified that error appears in the above-identified patent and that said Letters Patent is hereby corrected as shown below:

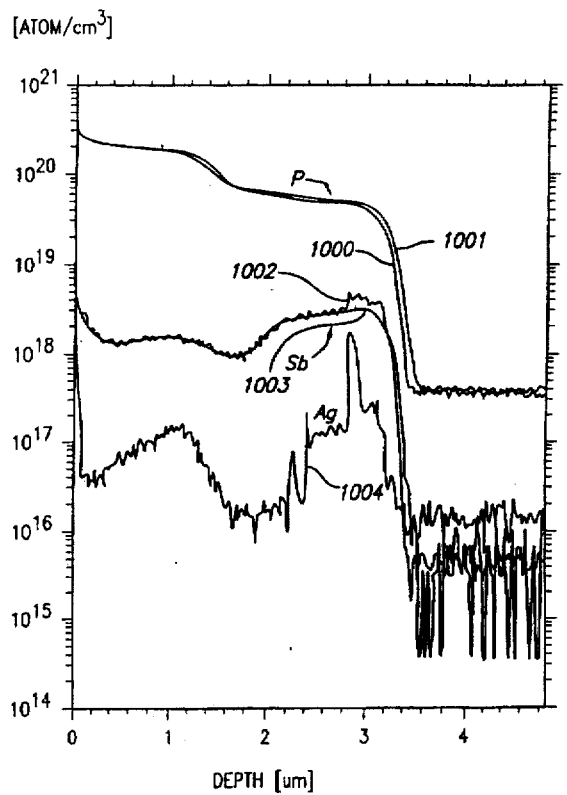

FIG. 10

UNITED STATES PATENT AND TRADEMARK OFFICE
CERTIFICATE OF CORRECTION

PATENT NO.    : 6,180,869 B1
DATED         : January 30, 2001
INVENTOR(S)   : Daniel L. Meier et al.

It is certified that error appears in the above-identified patent and that said Letters Patent is hereby corrected as shown below:

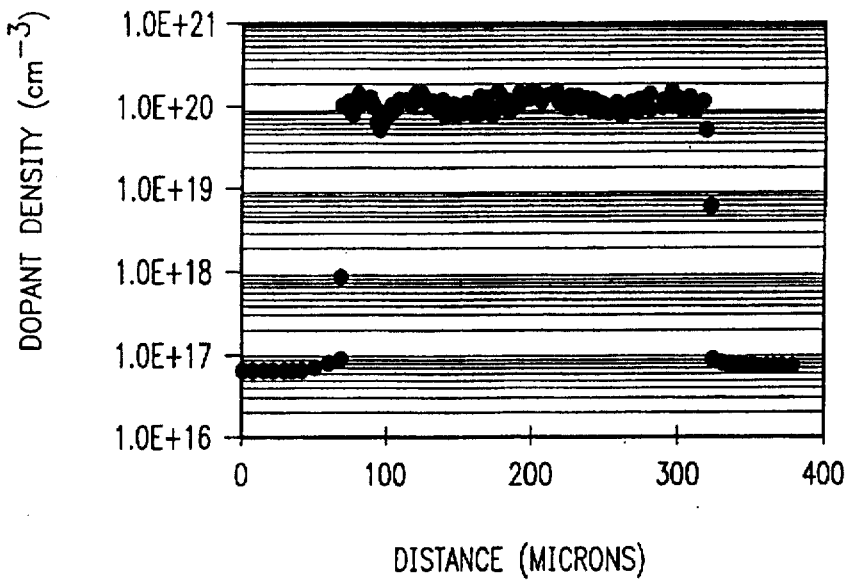

Signed and Sealed this

Twenty-eighth Day of May, 2002

*Attest:*

JAMES E. ROGAN
*Director of the United States Patent and Trademark Office*

*Attesting Officer*